(12) United States Patent
Chandrasekharan et al.

(10) Patent No.: US 10,741,365 B2
(45) Date of Patent: *Aug. 11, 2020

(54) LOW VOLUME SHOWERHEAD WITH POROUS BAFFLE

(71) Applicant: Lam Research Corporation, Fremont, CA (US)

(72) Inventors: Ramesh Chandrasekharan, Portland, OR (US); Saangrut Sangplung, Sherwood, OR (US); Shankar Swaminathan, Beaverton, OR (US); Frank L. Pasquale, Tualatin, OR (US); Hu Kang, Tualatin, OR (US); Adrien LaVoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 638 days.

This patent is subject to a terminal disclaimer.

(21) Appl. No.: 14/668,511

(22) Filed: Mar. 25, 2015

(65) Prior Publication Data

US 2015/0315706 A1    Nov. 5, 2015

Related U.S. Application Data

(60) Provisional application No. 61/988,834, filed on May 5, 2014.

(51) Int. Cl.
*H01J 37/32* (2006.01)
*C23C 16/455* (2006.01)
*C30B 25/14* (2006.01)

(52) U.S. Cl.
CPC .. *H01J 37/32449* (2013.01); *C23C 16/45544* (2013.01); *C23C 16/45565* (2013.01);
(Continued)

(58) Field of Classification Search
CPC ....... C23C 16/45512; C23C 16/45523–45555; C23C 16/455–4551;
(Continued)

(56) References Cited

U.S. PATENT DOCUMENTS 3,215,508 A   11/1965  Piester
4,577,203 A    3/1986  Kawamura
(Continued)

FOREIGN PATENT DOCUMENTS

CN    1445822 A    10/2003
CN    1802722 A     7/2006
(Continued)

OTHER PUBLICATIONS

U.S. Appl. No. 61/770,894, filed Feb. 28, 2013; in the names of Mohamed Sabri et al.; & entitled "Ceramic Showerhead with Embedded RF Electrode for Capacitively Coupled Plasma Reactor;" pp. 1-37. (Year: 2013).*
(Continued)

*Primary Examiner* — Jeffrie R Lund
*Assistant Examiner* — Stanislav Antolin
(74) *Attorney, Agent, or Firm* — Weaver Austin Villeneuve & Sampson LLP

(57) ABSTRACT

A low volume showerhead in a semiconductor processing apparatus can include a porous baffle to improve the flow uniformity and purge time during atomic layer deposition. The showerhead can include a plenum volume, one or more gas inlets in fluid communication with the plenum volume, a faceplate including a plurality of first through-holes for distributing gas onto a substrate in the semiconductor processing apparatus, and a porous baffle positioned in a region between the plenum volume and the one or more gas inlets. The one or more gas inlets can include a stem having a small volume to improve purge time. The baffle can be porous and
(Continued)

positioned between the stem and the plenum volume to improve flow uniformity and avoid jetting.

20 Claims, 10 Drawing Sheets

(52) U.S. Cl.
CPC .... *C23C 16/45591* (2013.01); *H01J 37/3244* (2013.01); *C30B 25/14* (2013.01)

(58) Field of Classification Search
CPC ......... C23C 16/45563–4558; C23C 16/45565; C23C 16/45587–45591; C23C 16/45591; C23C 16/505; C23C 16/50–5096; C23C 16/45544; H01J 37/32009–32422; H01J 37/3244–32449; H01J 37/32449; H01L 21/02271–0228; H01L 21/67011; H01L 21/67063–67069; Y10T 29/4943
See application file for complete search history.

(56) References Cited

U.S. PATENT DOCUMENTS

| | | | |
|---|---|---|---|
| 4,890,780 A | 1/1990 | Mimata et al. | |
| 4,960,488 A * | 10/1990 | Law | C23C 16/402 134/1 |
| 4,993,485 A * | 2/1991 | Gorman | F28F 9/00 165/109.1 |
| 5,106,453 A * | 4/1992 | Benko | C23C 16/455 117/104 |
| 5,186,756 A * | 2/1993 | Benko | C23C 16/455 118/715 |
| 5,212,116 A * | 5/1993 | Yu | H01L 21/02164 216/66 |
| 5,232,508 A | 8/1993 | Arena et al. | |
| 5,268,034 A * | 12/1993 | Vukelic | C23C 16/455 118/715 |
| 5,286,519 A * | 2/1994 | Vukelic | C30B 25/14 118/715 |
| 5,366,557 A * | 11/1994 | Yu | H01L 21/02164 118/715 |
| 5,376,213 A | 12/1994 | Ueda et al. | |
| 5,446,824 A | 8/1995 | Moslehi | |
| 5,452,396 A | 9/1995 | Sopori | |
| 5,453,124 A * | 9/1995 | Moslehi | C23C 16/45561 118/715 |
| 5,468,298 A * | 11/1995 | Lei | C23C 16/04 118/715 |
| 5,581,874 A * | 12/1996 | Aoki | H01L 21/67069 269/8 |
| 5,589,002 A * | 12/1996 | Su | H01J 37/3244 118/723 E |
| 5,614,026 A * | 3/1997 | Williams | C23C 16/4412 118/723 ER |
| 5,643,394 A * | 7/1997 | Maydan | C23C 16/45574 118/723 E |
| 5,653,479 A | 8/1997 | Henderson | |
| 5,670,218 A * | 9/1997 | Baek | C23C 16/409 118/50 |
| 5,741,363 A * | 4/1998 | Van Buskirk | C23C 16/45565 118/715 |
| 5,766,364 A * | 6/1998 | Ishida | C23C 16/45565 118/715 |
| 5,806,980 A | 9/1998 | Berrian | |
| 5,834,068 A | 11/1998 | Chern et al. | |
| 5,882,411 A | 3/1999 | Zhao et al. | |
| 5,948,704 A * | 9/1999 | Benjamin | H01J 37/20 118/723 R |
| 5,950,925 A | 9/1999 | Fukunaga et al. | |
| 5,958,140 A * | 9/1999 | Aranni | C23C 16/45502 118/725 |
| 5,992,453 A * | 11/1999 | Zimmer | B05C 1/10 137/561 A |
| 5,996,528 A * | 12/1999 | Berrian | C23C 16/45565 118/723 E |
| 6,010,748 A * | 1/2000 | Van Buskirk | C23C 16/455 427/248.1 |
| 6,022,413 A | 2/2000 | Shinozaki et al. | |
| 6,022,586 A * | 2/2000 | Hashimoto | C23C 16/4404 134/1.1 |
| 6,025,013 A * | 2/2000 | Heming | C23C 16/455 427/162 |
| 6,054,013 A | 4/2000 | Collins et al. | |
| 6,059,885 A * | 5/2000 | Ohashi | C23C 16/4401 118/730 |
| 6,112,697 A | 9/2000 | Sharan et al. | |
| 6,190,732 B1 * | 2/2001 | Omstead | C23C 16/4408 118/729 |
| 6,205,869 B1 * | 3/2001 | Schadt | G01N 1/14 73/863.71 |
| 6,237,528 B1 | 5/2001 | Szapucki et al. | |
| 6,245,192 B1 | 6/2001 | Dhindsa et al. | |
| 6,289,842 B1 | 9/2001 | Tompa | |
| 6,364,949 B1 | 4/2002 | Or et al. | |
| 6,379,056 B1 | 4/2002 | Ueda | |
| 6,415,736 B1 * | 7/2002 | Hao | H01L 21/67017 118/723 E |
| 6,444,039 B1 * | 9/2002 | Nguyen | C23C 16/455 118/715 |
| 6,453,992 B1 | 9/2002 | Kim | |
| 6,499,425 B1 * | 12/2002 | Sandhu | C23C 16/34 118/723 E |
| 6,537,420 B2 * | 3/2003 | Rose | C23C 16/45565 118/715 |
| 6,565,661 B1 * | 5/2003 | Nguyen | C23C 16/4557 118/715 |
| 6,616,767 B2 | 9/2003 | Zhao et al. | |
| 6,716,287 B1 * | 4/2004 | Santiago | C23C 16/4412 118/728 |
| 6,793,733 B2 * | 9/2004 | Janakiraman | C23C 16/455 118/715 |
| 6,821,347 B2 | 11/2004 | Carpenter et al. | |
| 6,883,733 B1 | 4/2005 | Lind | |
| 6,921,556 B2 | 7/2005 | Shimizu et al. | |
| 6,983,892 B2 | 1/2006 | Noorbakhsh et al. | |
| 7,217,326 B2 * | 5/2007 | Lee | C23C 16/455 118/715 |
| 7,296,534 B2 | 11/2007 | Fink | |
| D593,640 S * | 6/2009 | Schoenherr | D23/213 |
| 7,682,946 B2 * | 3/2010 | Ma | C23C 16/18 257/E21.09 |
| 7,712,434 B2 | 5/2010 | Dhindsa et al. | |
| 7,737,035 B1 * | 6/2010 | Lind | C23C 16/4409 438/680 |
| 7,993,457 B1 * | 8/2011 | Krotov | C23C 16/45544 118/719 |
| 8,137,467 B2 | 3/2012 | Meinhold et al. | |
| 8,187,679 B2 | 5/2012 | Dickey et al. | |
| 8,443,756 B2 | 5/2013 | Fischer et al. | |
| 8,562,785 B2 | 10/2013 | Kang et al. | |
| 8,673,080 B2 | 3/2014 | Meinhold et al. | |
| 8,728,956 B2 | 5/2014 | LaVoie et al. | |
| 8,980,006 B2 * | 3/2015 | Huh | C23C 16/18 257/E21.09 |
| 9,017,481 B1 * | 4/2015 | Pettinger | H01J 37/32449 118/708 |
| 9,034,142 B2 | 5/2015 | Bartlett et al. | |
| 9,314,854 B2 * | 4/2016 | Huang | B28D 5/021 |
| 9,441,296 B2 * | 9/2016 | Sabri | C23C 16/45565 |
| 9,449,795 B2 * | 9/2016 | Sabri | C23C 16/505 |
| 9,476,120 B2 * | 10/2016 | Meinhold | C23C 16/45565 |
| 9,758,868 B1 * | 9/2017 | Breiling | C23C 16/4408 |
| 9,793,096 B2 * | 10/2017 | Kang | C23C 16/509 |
| 10,022,689 B2 * | 7/2018 | Shareef | B01F 3/02 |
| 10,023,959 B2 | 7/2018 | Sung et al. | |
| 10,221,484 B2 * | 3/2019 | Meinhold | C23C 16/45565 |
| 10,253,412 B2 * | 4/2019 | Thomas | C23C 16/45519 |
| 10,266,947 B2 * | 4/2019 | Madsen | B23K 20/1205 |
| 10,358,722 B2 * | 7/2019 | Wiltse | H01J 37/3244 |
| 10,378,107 B2 * | 8/2019 | Chandrasekharan | C23C 16/50 |

(56) References Cited

U.S. PATENT DOCUMENTS

| | | | |
|---|---|---|---|
| 10,400,333 B2 | 9/2019 | Sabri et al. | |
| 10,403,474 B2* | 9/2019 | Phillips | H01J 37/32091 |
| 10,494,717 B2 | 12/2019 | Sung et al. | |
| 2001/0027026 A1* | 10/2001 | Dhindsa | C23C 16/455 |
| | | | 438/712 |
| 2001/0035127 A1 | 11/2001 | Metzner et al. | |
| 2002/0017243 A1* | 2/2002 | Pyo | C23C 16/18 |
| | | | 118/715 |
| 2002/0069969 A1* | 6/2002 | Rose | C23C 16/45565 |
| | | | 156/345.34 |
| 2002/0123230 A1* | 9/2002 | Hubacek | C23C 16/45565 |
| | | | 438/712 |
| 2002/0134507 A1* | 9/2002 | DeDontney | C23C 16/45576 |
| | | | 156/345.33 |
| 2002/0144783 A1 | 10/2002 | Tran et al. | |
| 2002/0144785 A1* | 10/2002 | Srivastava | H01J 37/32192 |
| | | | 156/345.35 |
| 2003/0010452 A1* | 1/2003 | Park | C23C 16/45565 |
| | | | 156/345.33 |
| 2003/0051665 A1* | 3/2003 | Zhao | C23C 16/45565 |
| | | | 118/723 E |
| 2003/0054099 A1* | 3/2003 | Jurgensen | C23C 14/0015 |
| | | | 427/248.1 |
| 2003/0066607 A1* | 4/2003 | White | C23C 16/455 |
| | | | 156/345.34 |
| 2003/0106490 A1* | 6/2003 | Jallepally | C23C 16/45521 |
| | | | 117/89 |
| 2003/0168001 A1* | 9/2003 | Sneh | C23C 16/02 |
| | | | 117/86 |
| 2003/0170388 A1* | 9/2003 | Shinriki | C23C 16/452 |
| | | | 427/248.1 |
| 2004/0003777 A1* | 1/2004 | Carpenter | C23C 16/45544 |
| | | | 118/715 |
| 2004/0005731 A1* | 1/2004 | Jurgensen | C23C 16/455 |
| | | | 438/100 |
| 2004/0023461 A1 | 2/2004 | Ahn et al. | |
| 2004/0050325 A1* | 3/2004 | Samoilov | C23C 16/45561 |
| | | | 118/715 |
| 2004/0050326 A1* | 3/2004 | Thilderkvist | C23C 16/45561 |
| | | | 118/715 |
| 2004/0050496 A1 | 3/2004 | Iwai et al. | |
| 2004/0134611 A1* | 7/2004 | Kato | C23C 16/455 |
| | | | 156/345.33 |
| 2004/0149215 A1* | 8/2004 | Shao | C23C 16/45565 |
| | | | 118/722 |
| 2004/0200412 A1* | 10/2004 | Frijlink | C23C 16/4412 |
| | | | 118/715 |
| 2004/0200413 A1* | 10/2004 | Lee | C23C 16/455 |
| | | | 118/715 |
| 2004/0231799 A1* | 11/2004 | Lee | C23C 16/4412 |
| | | | 156/345.34 |
| 2004/0235299 A1* | 11/2004 | Srivastava | G03F 7/427 |
| | | | 438/689 |
| 2004/0238123 A1* | 12/2004 | Becknell | H01J 37/32357 |
| | | | 156/345.33 |
| 2005/0000423 A1 | 1/2005 | Kasai et al. | |
| 2005/0000442 A1 | 1/2005 | Hayashi et al. | |
| 2005/0017100 A1 | 1/2005 | Watanabe et al. | |
| 2005/0022748 A1* | 2/2005 | Gabriel | A01K 1/031 |
| | | | 119/72.5 |
| 2005/0145338 A1* | 7/2005 | Park | C23C 16/45565 |
| | | | 156/345.34 |
| 2005/0173404 A1 | 8/2005 | Benjamin et al. | |
| 2005/0173569 A1* | 8/2005 | Noorbakhsh | C23C 16/45565 |
| | | | 239/690 |
| 2005/0181617 A1* | 8/2005 | Bosch | C04B 41/0054 |
| | | | 438/710 |
| 2005/0205110 A1* | 9/2005 | Kao | H01J 37/32082 |
| | | | 134/1.1 |
| 2005/0218507 A1* | 10/2005 | Kao | H01J 37/32082 |
| | | | 257/704 |
| 2005/0221552 A1* | 10/2005 | Kao | H01J 37/32082 |
| | | | 438/200 |
| 2005/0230350 A1* | 10/2005 | Kao | H01J 37/32082 |
| | | | 216/67 |
| 2005/0241765 A1 | 11/2005 | Dhindsa et al. | |
| 2005/0241766 A1* | 11/2005 | Dhindsa | H01J 37/32009 |
| | | | 156/345.34 |
| 2005/0242061 A1 | 11/2005 | Fukuda | |
| 2005/0284372 A1* | 12/2005 | Murugesh | C23C 16/4404 |
| | | | 118/715 |
| 2006/0005767 A1* | 1/2006 | Tsai | C23C 16/4404 |
| | | | 118/715 |
| 2006/0046470 A1* | 3/2006 | Becknell | G03F 7/427 |
| | | | 438/637 |
| 2006/0112876 A1* | 6/2006 | Choi | C23C 16/45563 |
| | | | 118/715 |
| 2006/0137607 A1 | 6/2006 | Seo et al. | |
| 2007/0116872 A1* | 5/2007 | Li | C23C 16/12 |
| | | | 427/248.1 |
| 2007/0116873 A1* | 5/2007 | Li | C23C 16/4401 |
| | | | 427/248.1 |
| 2007/0119371 A1* | 5/2007 | Ma | C23C 16/18 |
| | | | 118/723 E |
| 2007/0128862 A1 | 6/2007 | Ma et al. | |
| 2007/0128863 A1 | 6/2007 | Ma et al. | |
| 2007/0128864 A1* | 6/2007 | Ma | C23C 16/18 |
| | | | 438/680 |
| 2007/0145021 A1* | 6/2007 | Wang | H01J 37/3244 |
| | | | 219/121.43 |
| 2007/0157683 A1* | 7/2007 | Li | C23C 16/4401 |
| | | | 70/209 |
| 2007/0212484 A1* | 9/2007 | Li | C23C 16/4412 |
| | | | 427/248.1 |
| 2007/0246163 A1 | 10/2007 | Paterson et al. | |
| 2007/0248515 A1* | 10/2007 | Tompa | C23C 16/407 |
| | | | 423/179 |
| 2007/0275569 A1 | 11/2007 | Moghadam et al. | |
| 2007/0286967 A1* | 12/2007 | Ide | C23C 16/5096 |
| | | | 427/569 |
| 2008/0006204 A1* | 1/2008 | Rusinko | C23C 16/4581 |
| | | | 118/715 |
| 2008/0006208 A1* | 1/2008 | Ueno | C23C 16/303 |
| | | | 118/730 |
| 2008/0016684 A1* | 1/2008 | Olechnowicz | H01L 21/67103 |
| | | | 29/748 |
| 2008/0053614 A1 | 3/2008 | Sago et al. | |
| 2008/0081114 A1 | 4/2008 | Johanson et al. | |
| 2008/0081124 A1* | 4/2008 | Sang; Shojiro | C09D 11/101 |
| | | | 427/508 |
| 2008/0085226 A1* | 4/2008 | Fondurulia | C23C 16/4481 |
| | | | 422/198 |
| 2008/0093341 A1* | 4/2008 | Turlot | C23C 16/455 |
| | | | 216/71 |
| 2008/0099145 A1* | 5/2008 | Keller | C23C 16/45565 |
| | | | 156/345.34 |
| 2008/0141941 A1* | 6/2008 | Augustino | C23C 16/45565 |
| | | | 118/723 R |
| 2008/0241379 A1* | 10/2008 | Suzuki | C23C 16/16 |
| | | | 427/255.15 |
| 2008/0241517 A1* | 10/2008 | Kenworthy | B32B 15/01 |
| | | | 428/332 |
| 2008/0242085 A1* | 10/2008 | Fischer | C23C 16/45565 |
| | | | 438/680 |
| 2008/0308228 A1* | 12/2008 | Stevenson | H01J 37/32091 |
| | | | 156/345.34 |
| 2009/0000743 A1 | 1/2009 | Iizuka | |
| 2009/0017227 A1* | 1/2009 | Fu | C23C 16/0245 |
| | | | 427/569 |
| 2009/0081878 A1* | 3/2009 | Dhindsa | H01J 37/32091 |
| | | | 438/729 |
| 2009/0095218 A1* | 4/2009 | Meinhold | C23C 16/45565 |
| | | | 118/708 |
| 2009/0095219 A1* | 4/2009 | Meinhold | C23C 16/45565 |
| | | | 118/708 |
| 2009/0095220 A1* | 4/2009 | Meinhold | C23C 16/45565 |
| | | | 118/712 |

(56) References Cited

U.S. PATENT DOCUMENTS

| | | | |
|---|---|---|---|
| 2009/0095621 A1 | 4/2009 | Kao et al. | |
| 2009/0211085 A1* | 8/2009 | Kennedy | H01J 37/32009 29/825 |
| 2009/0260571 A1* | 10/2009 | Ostrowski | C23C 16/45565 118/728 |
| 2009/0305509 A1* | 12/2009 | Stevenson | C23C 16/45565 438/710 |
| 2010/0167551 A1* | 7/2010 | DeDontney | B01J 19/0046 438/758 |
| 2010/0184298 A1 | 7/2010 | Dhindsa | |
| 2010/0206376 A1* | 8/2010 | You | C23C 16/24 136/256 |
| 2010/0230387 A1* | 9/2010 | Okesaku | C23C 16/45565 216/69 |
| 2010/0261354 A1* | 10/2010 | Bettencourt | H01J 37/16 438/710 |
| 2010/0263588 A1* | 10/2010 | Zhiyin | C23C 16/45508 117/98 |
| 2010/0272895 A1* | 10/2010 | Tsuda | C23C 16/409 427/255.32 |
| 2010/0276084 A1* | 11/2010 | Yao | C23C 16/45565 156/345.34 |
| 2010/0279008 A1* | 11/2010 | Takagi | C23C 16/409 427/248.1 |
| 2010/0288439 A1* | 11/2010 | Ishibashi | C23C 16/45565 156/345.33 |
| 2011/0011338 A1 | 1/2011 | Chuc et al. | |
| 2011/0048642 A1* | 3/2011 | Mihara | H01J 37/32192 156/345.34 |
| 2011/0052833 A1 | 3/2011 | Hanawa et al. | |
| 2011/0076401 A1* | 3/2011 | Chao | C23C 16/325 427/249.16 |
| 2011/0146571 A1* | 6/2011 | Bartlett | C23C 16/4401 118/667 |
| 2011/0159690 A1* | 6/2011 | Chandrashekar | H01L 21/28556 438/675 |
| 2011/0256726 A1 | 10/2011 | LaVoie et al. | |
| 2011/0300716 A1* | 12/2011 | Park | C23C 16/36 438/758 |
| 2012/0077349 A1* | 3/2012 | Li | C23C 16/45542 438/762 |
| 2012/0090691 A1* | 4/2012 | Baluja | C23C 16/4405 137/13 |
| 2012/0156877 A1* | 6/2012 | Yap | C23C 16/45565 438/689 |
| 2012/0156880 A1* | 6/2012 | Panagopoulos | C23C 16/045 438/694 |
| 2012/0174866 A1* | 7/2012 | Huh | C23C 16/18 438/680 |
| 2012/0222815 A1* | 9/2012 | Sabri | C23C 16/45565 156/345.34 |
| 2012/0227665 A1* | 9/2012 | Ozgun | C23C 16/4411 118/666 |
| 2012/0264051 A1* | 10/2012 | Angelov | H01L 21/683 430/256 |
| 2012/0269968 A1* | 10/2012 | Rayner, Jr. | C23C 16/452 427/255.26 |
| 2012/0305190 A1* | 12/2012 | Kang | H01J 37/321 156/345.34 |
| 2012/0309204 A1* | 12/2012 | Kang | H01J 37/3244 438/719 |
| 2013/0034967 A1* | 2/2013 | Bettencourt | H01J 37/16 438/710 |
| 2013/0220975 A1* | 8/2013 | Dhindsa | H01J 37/321 216/68 |
| 2013/0299605 A1* | 11/2013 | Ehrlich | H01J 37/3244 239/128 |
| 2013/0341433 A1 | 12/2013 | Roy et al. | |
| 2014/0061324 A1 | 3/2014 | Mohn et al. | |
| 2014/0103145 A1* | 4/2014 | White | H01J 37/32449 239/548 |
| 2014/0103806 A1* | 4/2014 | Kellogg | H01J 37/32449 315/111.21 |
| 2014/0158792 A1* | 6/2014 | Meinhold | C23C 16/45565 239/132.3 |
| 2014/0179114 A1 | 6/2014 | van Schravendijk | |
| 2014/0235069 A1 | 8/2014 | Breiling et al. | |
| 2014/0238608 A1* | 8/2014 | Sabri | C23C 16/505 156/345.34 |
| 2014/0299681 A1* | 10/2014 | Kashyap | C23C 16/45525 239/553.5 |
| 2014/0306027 A1* | 10/2014 | Xu | C23C 16/45565 239/132.3 |
| 2015/0004798 A1* | 1/2015 | Chandrasekharan | H01L 21/67017 438/758 |
| 2015/0007770 A1 | 1/2015 | Chandrasekharan et al. | |
| 2015/0011095 A1* | 1/2015 | Chandrasekharan | H01L 21/67017 438/758 |
| 2015/0011096 A1 | 1/2015 | Chandrasekharan et al. | |
| 2015/0187568 A1* | 7/2015 | Pettinger | H01J 37/3244 118/708 |
| 2015/0218701 A1* | 8/2015 | Bartlett | C23C 16/4401 118/667 |
| 2015/0315706 A1* | 11/2015 | Chandrasekharan | C23C 16/45565 156/345.34 |
| 2015/0377481 A1* | 12/2015 | Smith | F22B 1/28 392/396 |
| 2016/0079036 A1* | 3/2016 | Kang | C23C 16/509 156/345.34 |
| 2016/0340781 A1* | 11/2016 | Thomas | C23C 16/45519 |
| 2016/0340782 A1* | 11/2016 | Chandrasekharan | C23C 16/45565 |
| 2016/0343595 A1* | 11/2016 | Lind | C23C 16/4544 |
| 2016/0348242 A1* | 12/2016 | Sung | C23C 16/4574 |
| 2016/0348244 A1* | 12/2016 | Sabri | C23C 16/45565 |
| 2017/0009344 A1* | 1/2017 | Meinhold | C23C 16/45565 |
| 2017/0021317 A1* | 1/2017 | Shareef | B01F 3/02 |
| 2017/0167024 A1* | 6/2017 | Wiltse | C23C 16/45574 |
| 2017/0260627 A1* | 9/2017 | Breiling | C23C 16/4408 |
| 2017/0301515 A1* | 10/2017 | Madsen | C23C 16/45591 |
| 2018/0012733 A1* | 1/2018 | Phillips | C23C 16/45544 |
| 2018/0057940 A1* | 3/2018 | Madsen | |
| 2018/0068833 A1* | 3/2018 | Kang | C23C 16/509 |
| 2018/0340256 A1 | 11/2018 | Sung et al. | |
| 2019/0211451 A1* | 7/2019 | Madsen | B23K 20/1205 |

FOREIGN PATENT DOCUMENTS

| | | | |
|---|---|---|---|
| CN | 2893917 Y | 4/2007 | |
| CN | 101101887 A | 1/2008 | |
| CN | 100487857 C | 5/2009 | |
| CN | 101448977 A | 6/2009 | |
| CN | 201343570 Y | 11/2009 | |
| CN | 200820135478.5 | 11/2009 | |
| CN | 101916715 A | 12/2010 | |
| CN | 102102194 A | 6/2011 | |
| CN | 102132383 A | 7/2011 | |
| CN | 202025711 U | 11/2011 | |
| CN | 103403843 A | 11/2013 | |
| CN | 103521956 A | 1/2014 | |
| CN | 103890911 A | 6/2014 | |
| EP | 0 462 730 A1 | 12/1991 | |
| EP | 1568797 A2 | 8/2005 | |
| JP | 07-045542 | 2/1995 | |
| JP | 2002-033311 A | 1/2002 | |
| JP | 3147392 | 12/2008 | |
| JP | 2014-070249 A | 4/2014 | |
| JP | 5468735 B2 | 4/2014 | |
| JP | 2014-078685 A | 5/2014 | |
| KR | 20100134215 A * | 12/2010 | H01L 21/02 |
| KR | 20-0454281 | 6/2011 | |
| SG | 152163 | 5/2011 | |
| TW | 300319 B | 3/1997 | |
| TW | 200610033 A | 3/2006 | |
| TW | 200923126 | 6/2009 | |

(56) References Cited

FOREIGN PATENT DOCUMENTS

| TW | 200924049 A | 6/2009 | |
|---|---|---|---|
| TW | M361710 | 7/2009 | |
| TW | 201132793 | 10/2011 | |
| TW | 201411761 A | 3/2014 | |
| TW | 201502310 A | 1/2015 | |
| TW | 201509537 A | 3/2015 | |
| WO | WO 00/42236 | 7/2000 | |
| WO | WO 2004/107413 A2 | 12/2004 | |
| WO | WO 2005/103323 | 11/2005 | |
| WO | WO 2006/022997 | 3/2006 | |
| WO | WO 2007060143 A1 * | 5/2007 | ......... C23C 16/4401 |
| WO | WO 2007/142690 A2 | 12/2007 | |
| WO | WO 2008/042032 | 4/2008 | |
| WO | WO 2009/055244 A1 | 4/2009 | |
| WO | WO 2009/089794 A1 | 7/2009 | |
| WO | WO 2012/122054 | 9/2012 | |
| WO | WO 2012/166362 | 12/2012 | |

OTHER PUBLICATIONS

Bartlett et al., U.S. Appl. No. 14/687,134, "Temperature Controlled Showerhead for High Temperature Operations," filed Apr. 15, 2015.
U.S. Office Action, dated Sep. 17, 2010, issued in U.S. Appl. No. 11/974,966.
U.S. Final Office Action, dated Mar. 21, 2011, issued in U.S. Appl. No. 11/974,966.
U.S. Office Action, dated Sep. 2, 2011, issued in U.S. Appl. No. 11/974,966.
U.S. Notice of Allowance, dated Jan. 6, 2012, issued in U.S. Appl. No. 11/974,966.
U.S. Office Action, dated Sep. 17, 2010, issued in U.S. Appl. No. 12/181,927.
U.S. Final Office Action, dated Mar. 28, 2011, issued in U.S. Appl. No. 12/181,927.
U.S. Examiner's Answer, dated Dec. 21, 2011, issued in U.S. Appl. No. 12/181,927.
U.S. Patent Board Decision on Appeal dated Aug. 19, 2013 issued in U.S. Appl. No. 12/181,927.
U.S. Notice of Allowance, dated Oct. 25, 2013, issued in U.S. Appl. No. 12/181,927.
U.S. Office Action, dated Sep. 17, 2010, issued in U.S. Appl. No. 11/974,945.
U.S. Final Office Action, dated Mar. 21, 2011, issued in U.S. Appl. No. 11/974,945.
U.S. Office Action, dated Aug. 17, 2011, issued in U.S. Appl. No. 12/148,267.
U.S. Final Office Action, dated Jan. 30, 2012, issued in U.S. Appl. No. 12/148,267.
U.S. Office Action, dated Nov. 8, 2012, issued in U.S. Appl. No. 12/642,497.
U.S. Final Office Action, dated Apr. 8, 2013, issued in U.S. Appl. No. 12/642,497.
U.S. Office Action, dated Jul. 12, 2013, issued in U.S. Appl. No. 12/642,497.
U.S. Final Office Action, dated Nov. 6, 2013, issued in U.S. Appl. No. 12/642,497.
U.S. Office Action, dated Sep. 24, 2014, issued in U.S. Appl. No. 12/642,497.
U.S. Notice of Allowance, dated Jan. 15, 2015, issued in U.S. Appl. No. 12/642,497.
Chinese Office Action, dated May 12, 2009, issued in Application No. 200820135478.5.
Korean Office Action, dated Dec. 31, 2010, issued in Application No. 2008-0013796.
SG Search and Examination Report, dated May 3, 2010, issued in Application No. 2008/07575-6.
Chinese First Office Action, dated Feb. 8, 2014, issued in Application No. 201010602102.2.
Chinese Second Office Action, dated Aug. 29, 2014, issued in Application No. 201010602102.2.
SG Search and Examination Report, dated Mar. 5, 2012, issued in Application No. 201009408-4.
TW Office Action, dated Mar. 26, 2015, issued in Application No. 099144608.
PCT International Search Report and Written Opinion dated Sep. 27, 2012 issued in PCT/US2012/027596.
PCT International Report on Patentability dated Sep. 19, 2013 issued in PCT/US2012/027596.
Novellus, XL, High Vacuum Angle Valve, Air Operated, Lam Research, DOC-3076a, Document Control Released Oct. 25, 2012, 5 pages.
U.S. Office Action, dated Sep. 14, 2017, issued in U.S. Appl. No. 14/716,823.
U.S. Office Action, dated Mar. 11, 2016, issued in U.S. Appl. No. 14/169,325.
U.S. Notice of Allowance, dated Jun. 22, 2016, issued in U.S. Appl. No. 14/169,325.
U.S. Miscellaneous Communication, dated Jul. 11, 2016, issued in U.S. Appl. No. 14/169,325.
U.S. Office Action, dated May 3, 2017, issued in U.S. Appl. No. 14/687,134.
U.S. Final Office Action, dated Jul. 20, 2017, issued in U.S. Appl. No. 14/687,134.
Chinese First Office Action, dated Apr. 19, 2017, issued in Application No. CN 201510221479.6.
Korean First Office Action, dated Dec. 12, 2016, issued in Application No. KR 2010-0129965.
Taiwan Office Action, dated May 17, 2016, issued in Application No. TW104138639.
U.S. Office Action, dated Apr. 4, 2018, issued in U.S. Appl. No. 14/850,816.
U.S. Office Action, dated Apr. 21, 2010, issued in U.S. Appl. No. 11/542,959.
U.S. Final Office Action, dated Oct. 28, 2010, issued in U.S. Appl. No. 11/542,959.
U.S. Office Action, dated Feb. 16, 2011, issued in U.S. Appl. No. 11/542,959.
U.S. Final Office Action, dated Jul. 21, 2011, issued in U.S. Appl. No. 11/542,959.
U.S. Notice of Allowance dated Mar. 8, 2018, issued in U.S. Appl. No. 15/163,594.
Chinese Second Office Action, dated Nov. 16, 2017, issued in Application No. CN 201510221479.6.
PCT International Search Report and Written Opinion dated Jan. 10, 2008, issued in PCT/US2007/015979.
PCT International Preliminary Report on Patentability and Written Opinion dated Apr. 7, 2009, issued in PCT/US2007/015979.
Chinese First Office Action dated Apr. 10, 2018 issued in Application No. CN 201610361563.2.
U.S. Final Office Action dated May 18, 2018, issued in U.S. Appl. No. 14/716,823.
U.S. Office Action Interview Summary dated Jul. 18, 2018, issued in U.S. Appl. No. 14/716,823.
U.S. Final Office Action dated Oct. 18, 2018 issued in U.S. Appl. No. 14/850,816.
U.S. Office Action dated Jun. 15, 2018, issued in U.S. Appl. No. 15/275,060.
U.S. Notice of Allowance dated Oct. 19, 2018, issued in U.S. Appl. No. 15/275,060.
U.S. Office Action dated Nov. 28, 2018, issued in U.S. Appl. No. 16/035,491.
Chinese Third Office Action, dated May 15, 2018, issued in Application No. CN 201510221479.6.
Chinese First Office Action, dated May 17, 2018, issued in Application No. CN 201610345779.X.
U.S. Notice of Allowance dated Mar. 21, 2019 issued in U.S. Appl. No. 14/850,816.
U.S. Notice of allowance dated Mar. 22, 2019 issued in U.S. Appl. No. 16/035,491.
U.S. Notice of Allowance dated Jul. 30, 2019 issued in U.S. Appl. No. 16/035,491.
Taiwan First Office Action dated Feb. 27, 2019, issued in Application No. TW 104114093.

(56) References Cited

OTHER PUBLICATIONS

Chinese Second Office Action dated Apr. 10, 2019, issued in Application No. CN 201610345779.X.
Japanese Office Action, dated Mar. 19, 2019, issued in Application No. JP 2015-090931.
Taiwanese First Office Action dated Aug. 7, 2019 issued in Application No. TW 105116200.
U.S. Notice of Allowance dated Oct. 15, 2019, issued in U.S. Appl. No. 16/291,822.
Chinese Third Office Action, dated Sep. 25, 2019, issued in Application No. CN 201610345779.X.
Japanese Office Action, dated Nov. 26, 2019, issued in Application No. JP 2015-090931.

* cited by examiner

LOW VOLUME SHOWERHEAD WITH POROUS BAFFLE

CROSS-REFERENCE TO RELATED APPLICATIONS

This application claims the benefit of U.S. Provisional Patent Application No. 61/988,834, filed May 5, 2014, and titled "ULTRA LOW VOLUME SHOWERHEAD FOR ATOMIC LAYER DEPOSITION," which is incorporated by reference herein in its entirety and for all purposes.

INTRODUCTION

Field of the Invention

This disclosure generally relates to showerheads for distributing gas in semiconductor processing apparatuses. Certain aspects of this disclosure pertain to a low volume showerhead with a porous baffle for distributing gas in atomic layer deposition processes.

Background

Semiconductor processing tools often include components designed to distribute process gases in a relatively even manner across a semiconductor substrate or wafer. Such components are commonly referred to in the industry as "showerheads." Showerheads typically include a faceplate that fronts a plenum volume of some sort. The faceplate may include a plurality of through-holes that allow gas in the plenum volume to flow through the faceplate and into a reaction space between the substrate and the faceplate (or between a wafer support supporting the wafer and the faceplate). The through-holes are typically arranged such that the gas distribution across the wafer results in substantially uniform substrate processing.

SUMMARY

This disclosure pertains to a showerhead for use in a semiconductor processing apparatus. The showerhead includes a plenum volume having a first surface and a second surface opposite the first surface, the first surface and the second surface at least partially defining the plenum volume of the showerhead. The showerhead also includes one or more gas inlets in fluid communication with the plenum volume, a faceplate including a plurality of first through-holes, and a baffle including a plurality of second through-holes. The plurality of first through-holes extend from a first side to a second side of the faceplate, where the first side of the faceplate defines the first surface of the plenum volume. The baffle includes a plurality of second through-holes, where the baffle is positioned in a region between the plenum volume and the one or more gas inlets.

In some implementations, a diameter of the faceplate is at least four times greater than a diameter of the baffle. In some implementations, a volume of the showerhead is between about 50 milliliters and about 500 milliliters. In some implementations, a porosity of the baffle is between about 5% and about 25%. In some implementations, the plurality of second through-holes are positioned more towards the edges of the baffle than the center of the baffle. In some implementations, the showerhead further includes a backplate opposite the faceplate, where a side of the backplate defines the second surface of the plenum volume, and where the region between the plenum volume and the one or more gas inlets is recessed into the side of the backplate defining the second surface of the plenum volume.

This disclosure also pertains to a semiconductor processing station including the aforementioned showerhead. The semiconductor processing station includes a controller configured with instructions to perform the following operations: providing a substrate into the semiconductor processing station, introducing reactant gas into the semiconductor processing station through the showerhead to adsorb onto the surface of the substrate, introducing a purge gas into the semiconductor processing station through the showerhead, and applying a plasma to form a thin film layer from the adsorbed reactant gas on the surface of the substrate.

In some implementations, a film non-uniformity of the thin film layer is less than about 0.5%. In some implementations, the film non-uniformity is decoupled from one or more process parameters associated with one or more of introducing the gas reactant, introducing the purge gas, and applying the plasma. In some implementations, forming the thin film layer in an atomic layer deposition (ALD) cycle is performed in less than about 1.5 seconds.

This disclosure also pertains to a semiconductor processing tool including the aforementioned semiconductor processing station. In some implementations, the semiconductor processing tool includes a stepper.

DETAILED DESCRIPTION

Figure 1:
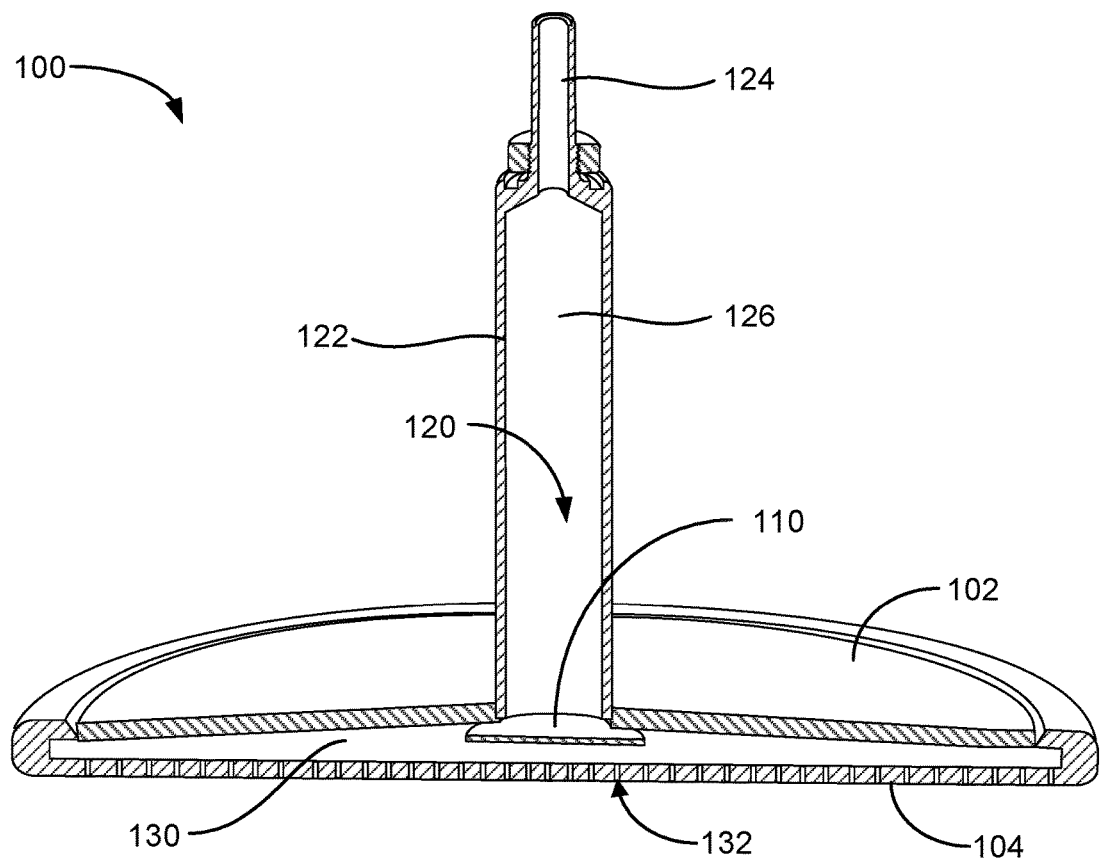
FIG. 1 shows an isometric section view of an example showerhead with a baffle.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

Several conventions may have been adopted in some of the drawings and discussions in this disclosure. For example, reference is made at various points to "volumes," e.g., "plenum volumes." These volumes may be generally indicated in various Figures, but it is understood that the Figures and the accompanying numerical identifiers represent an approximation of such volumes, and that the actual volumes may extend, for example, to various solid surfaces that bound the volumes. Various smaller volumes, e.g., gas inlets or other holes leading through an otherwise solid boundary surface of a plenum volume, may be fluidly connected to plenum volumes.

It is to be understood that the use of relative terms such as "above," "on top," "below," "underneath," etc. are to be understood to refer to spatial relationships of components with respect to the orientations of those components during normal use of a showerhead. In other words, the showerhead can be oriented so as to distribute gases downwards towards a substrate during substrate processing operations.

Introduction

Among various deposition techniques used in semiconductor processing, one particular deposition technique can include atomic layer deposition (ALD). In contrast with a chemical vapor deposition (CVD) process, where thermally activated gas phase reactions are used to deposit films, ALD processes use surface-mediated deposition reactions to deposit films on a layer-by-layer basis. In one example ALD process, a substrate surface, including a population of surface active sites, is exposed to a gas phase distribution of a first film precursor (P1). Some molecules of P1 may form a condensed phase atop the substrate surface, including chemisorbed species and physisorbed molecules of P1. The reactor is then evacuated to remove gas phase and physisorbed P1 so that only chemisorbed species remain. A second film precursor (P2) is then introduced to the reactor so that some molecules of P2 adsorb to the substrate surface. The reactor may again be evacuated, this time to remove unbound P2. Subsequently, energy provided to the substrate activates surface reactions between adsorbed molecules of P1 and P2, forming a film layer. Finally, the reactor is evacuated to remove reaction by-products and possibly unreacted P1 and P2, ending the ALD cycle. Additional ALD cycles may be included to build film thickness.

Depending on the exposure time of the precursor dosing steps and the sticking coefficients of the precursors, each ALD cycle may deposit a film layer of, in one example, between one-half and three angstroms thick. Each ALD cycle can last about 5 seconds or less, about 3 seconds or less, or about 2 seconds or less.

Conformal film deposition (CFD) is a deposition technique that is similar to ALD techniques in that deposition is performed over multiple cycles, with each cycle employing a small amount of reactant or precursor. Typically, the surface reaction to produce a CFD film is activated by exposure of the surface-adsorbed reactant(s) to a plasma, ultraviolet radiation, or similar source. In some cases, one reactant flows continuously during the deposition process, which may include several cycles of CFD. Unlike ALD processes, many CFD processes may allow two or more reactants to co-exist in the vapor phase within a chamber. In CFD, one or more process steps described in an ALD process may be shortened or eliminated in an example CFD process. Methods for forming films using CFD are described in U.S. patent application Ser. No. 13/084,399, filed on Apr. 11, 2011, and which is incorporated by reference herein for all purposes. For context, a short description of CFD is provided.

Generally, a CFD cycle is the minimum set of operations that may be performed for a surface deposition reaction. The result of one cycle is production of at least a partial thin film layer on a substrate surface. Typically, a CFD cycle will include only those steps necessary to deliver and adsorb each reactant to the substrate surface, and then react those adsorbed reactants to form the partial layer of film. Of course, the cycle may include certain ancillary steps such as sweeping one or more of the reactants or byproducts and/or treating the partial film as deposited. Generally, a cycle contains only one instance of a unique sequence of operations. As an example, a cycle may include the following operations: (i) delivery/adsorption of reactant A, (ii) delivery/adsorption of reactant B, (iii) sweep B out of the reaction chamber using a purge gas, and (iv) apply plasma to drive a surface reaction of A and B to form the partial film layer on the surface. In some implementations, these steps can be characterized as a dose step, a purge step, and a plasma step. In some implementations, a post-plasma purge step may be included in the cycle for further purging.

Some implementations may use different process sequences. One possible process includes the following sequence of operations: (1) flow auxiliary reactant continuously, (2) provide dose of silicon-containing or other principle reactant, (3) purge 1, (4) expose substrate to RF plasma, (5) purge 2. Another alternative process includes the following sequence of operations: (1) flow inert gas continuously, (2) provide dose of silicon-containing or other principle reactant, (3) purge 1, (4) expose substrate to RF plasma while providing dose of oxidant or other auxiliary reactant, (5) purge 2.

Generally, a concept of a "sweep" or "purge" phase removes or purges one of the vapor phase reactant from a reaction chamber and typically occurs only after delivery of such reactant is completed. In other words, that reactant is no longer delivered to the reaction chamber during the purge phase. However, the reactant remains adsorbed on the substrate surface during the purge phase. Typically, the purge serves to remove any residual vapor phase reactant in the chamber after the reactant is adsorbed on the substrate surface to the desired level. A purge phase may also remove weakly adsorbed species (e.g., certain precursor ligands or reaction by-products) from the substrate surface.

In semiconductor processing equipment, a showerhead is often used to distribute process gases across a semiconductor substrate in a desired manner, such as in an evenly distributed manner. Showerheads typically include a plenum that is bounded by a faceplate with a plurality of gas distribution holes that lead to the outside of the showerhead. The faceplate typically faces a substrate reaction area within a semiconductor processing chamber or reaction chamber, and substrates are usually placed beneath the faceplate within the semiconductor processing chamber, such as on a wafer support or pedestal that supports the wafer in a location below the faceplate.

Thin films are grown on a substrate surface in a self-limiting and self-saturating manner in ALD. In other words, precursors are delivered and react with the surface in a self-limiting way such that the reaction terminates once all the reactive sites on the surface are consumed. This means that a particular step in the ALD process has reached saturation. Typically, film uniformity is not an issue when full saturation is reached. However, many ALD processes operate more economically and desire a certain threshold of throughput. As a result, not all of the steps in ALD reach full saturation to achieve a desired throughput, so full saturation in ALD processes may be throughput-prohibitive. By way of an example, an ALD process may reach between about 70% and about 99% saturation to achieve a desired throughput. As used herein, ALD processes can include CFD processes and may be used interchangeably.

Thus, a higher throughput can be achieved at the expense of film uniformity, and greater film uniformity can be achieved at the expense of throughput. However, a showerhead of the present disclosure can be designed to improve film uniformity and throughput. In some implementations, the showerhead can be designed to facilitate the delivery of process or purge gases in ALD processes. In an ALD process, improvements to flow uniformity in delivery of reactants in the vapor phase can improve the uniformity of deposited films, particularly during the dosing and plasma steps. Also, improvements to purge time can improve the efficiency of the purge step, thereby increasing the throughput of the ALD process.

A showerhead that improves throughput can be obtained by reducing the volume of the showerhead. A plenum volume and a stem volume can be lowered or minimized to reduce purge time for completing the purging of precursors during the purge step. The reduced volume increases the backpressure so that purge gas can be quickly and efficiently delivered into a reaction chamber. However, reducing the volume of the showerhead can typically compromise the film uniformity of a deposited film. Obtaining a spatially uniform flow across a faceplate of a showerhead may be difficult in a low volume showerhead. A spatially non-uniform flow across the faceplate can result in thickness non-uniformities in the film being deposited. As noted above, in some ALD processes, a deposition cycle in an ALD process may be short and may not permit full saturation to be reached. Hence, spatially non-uniform flow across the faceplate may adversely affect film uniformity and film properties of deposited films.

Low Volume Showerhead with Porous Baffle

The present disclosure provides a showerhead having a reduced volume without suffering the penalty of spatially non-uniform flow. Such a low volume showerhead can include a porous baffle recessed into a region between a stem volume and a plenum volume. A low volume showerhead can refer to a showerhead having a total volume of about equal to or less than 500 milliliters. In some implementations, a low volume showerhead can have a volume between about 50 milliliters and about 500 milliliters. A conventional showerhead can have a volume greater than 500 milliliters, especially in ALD applications.

In general, there are two main types of showerheads: a chandelier type and a flush mount type. A chandelier type showerhead has a stem attached to the top of the chamber on one end and a faceplate or a backplate on the other end. A part of the stem may protrude from the chamber top for connecting gas lines and RF power. A flush mount showerhead type is integrated into the top of a chamber and typically does not have a stem. While the depicted drawings generally refer to chandelier type showerheads, it should be understood that the present disclosure can apply to flush mount type showerheads as well.

FIG. 1 shows an isometric section view of an example showerhead 100 with a baffle 110. The showerhead 100 in FIG. 1 can have a volume greater than 500 milliliters and include a non-porous baffle 110. As shown in FIG. 1, the showerhead 100 includes a backplate 102 and a faceplate 104, where the backplate 102 and the faceplate 104 may be separate mechanical components or integrated into a single body. The backplate 102 and the faceplate 104 may be positioned opposite one another. The faceplate 104 may have a plurality of gas distribution holes or through-holes 132 to facilitate delivery of gas to a substrate. A plenum volume 130 may be defined between the backplate 102 and the faceplate 104, where the plenum volume 130 can have a first surface and a second surface opposite the first surface. In some implementations, the first surface and the second surface of the plenum volume 130 can have circumferential surfaces. The first surface and the second surface can at least partially define the plenum volume 130 of the showerhead 100. A first side of the faceplate 104 can define the first surface of the plenum volume 130. A second side of the backplate 102 can define the second surface of the plenum volume 130. In some implementations, as illustrated in FIG. 1, the plenum volume 130 can be substantially conical in shape along the second surface of the plenum volume 130.

The plenum volume 130 may be supplied with a gas, such as reactant gas or purge gas, via one or more gas inlets 120. The gas inlet 120 in FIG. 1 may be connected to a gas supply or supplies for delivery of the gas. The gas inlet 120 can include a stem 122, where the stem 122 can include an expanded tube 126 connected to a narrow tube 124. The expanded tube 126 can have a diameter greater than a diameter of the narrow tube 124 to provide a more spatially distributed flow upon reaching the plenum volume 130.

The showerhead 100 can further include a baffle 110 recessed in the plenum volume 130. The baffle 110 may be a solid or non-porous structure mounted in the plenum volume 130 to direct the gas outwardly throughout the plenum volume 130 and towards the edge of the faceplate 104. The baffle 110 may be mounted at a certain distance from the gas inlet 120 to permit distribution of the gas within the plenum volume 130. Furthermore, the plenum volume 130 at the second surface can be conical to provide more space between the gas inlet 120 and the baffle 110. In some implementations, the baffle 110 can be circular and have a diameter greater than a diameter of the expanded tube 124. By directing the flow of gas outwardly throughout the plenum volume 130, greater flow uniformity can be obtained. Moreover, the baffle 110 can be substantially centered on the gas inlet 120 to avoid or otherwise minimize the flow of gas from jetting through the center of the faceplate 104.

Figure 2:
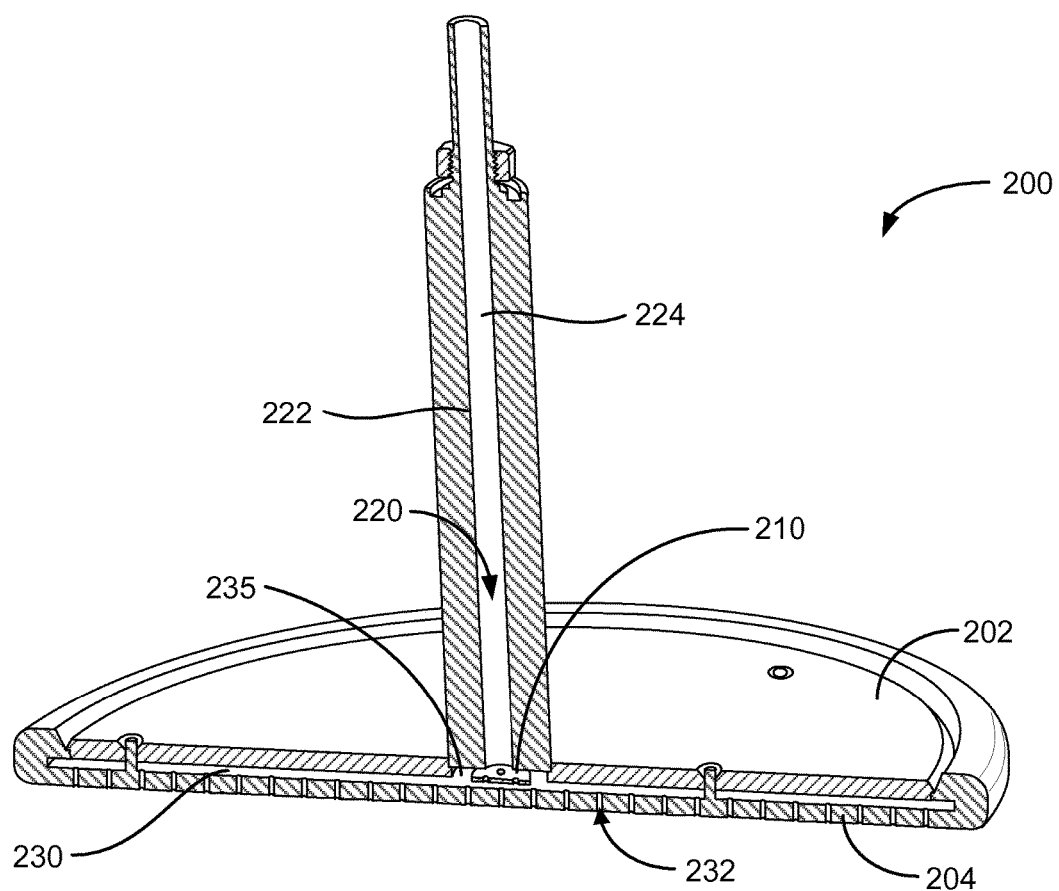
FIG. 2 shows an isometric section view of an example low volume showerhead with a porous baffle.

FIG. 2 shows an isometric section view of an example low volume showerhead 200 with a porous baffle 210. The porous baffle 210 may also be referred to as a porous baffle plate. The low volume showerhead 200 in FIG. 2 can have a volume between about 50 milliliters and about 500 milliliters and include a porous baffle 210. In some implementations, the low volume showerhead 200 can have a volume between about 100 milliliters and about 300 milliliters. The low volume showerhead 200 includes a backplate 202 and a faceplate 204, where the backplate 202 and the faceplate 204 may be separate mechanical components or integrated into a single body. The backplate 202 and the faceplate 204 may be positioned opposite one another. In some implementations, the backplate 202 and the faceplate 204 may each be cylindrical in shape. The faceplate 204 may have a plurality of through-holes 232 to facilitate delivery of gas to a substrate. In some implementations, the size (e.g., diameter) of the faceplate 204 may correspond or substantially correspond to the size of the substrate being processed. The through-holes 232 may extend through faceplate 204 from a first side to a second side of the faceplate 204. A plenum volume 230 may be defined between the backplate 202 and the faceplate 204, where the plenum volume 230 can have a first surface and a second surface opposite the first surface. In some implementations, the first surface and the second surface of the plenum volume 230 can have circumferential surfaces. The first surface and the second surface can at least partially define the plenum volume 230 of the low volume showerhead 200. A first side of the faceplate 204 can define the first surface of the plenum volume 230. A second side of the backplate 202 can define the second surface of the plenum volume 230. In some implementations, as illustrated in FIG. 2, the plenum volume 230 can be cylindrical or substantially cylindrical in shape. This can reduce the overall internal volume of the showerhead because the plenum volume 230 in FIG. 2 has a reduced volume compared to the plenum volume 130 in FIG. 1.

The plenum volume 230 may be supplied with a gas, such as reactant gas or purge gas, via one or more gas inlets 220. The gas inlet 220 in FIG. 2 may be connected to a gas supply or supplies for delivery of the gas. The gas inlet 220 can include a stem 222, where the stem 222 can include a narrow tube 224. The stem 222 can be in fluid communication with the plenum volume 230. The volume of the stem 222 can be between about 1 milliliter and about 50 milliliters in some implementations. Providing the narrow tube 224 as the entirety of the stem 222 can also reduce the overall internal volume of the showerhead because the narrow tube 224 in FIG. 2 has a smaller diameter than the expanded tube 126 in FIG. 1.

Figure 3:
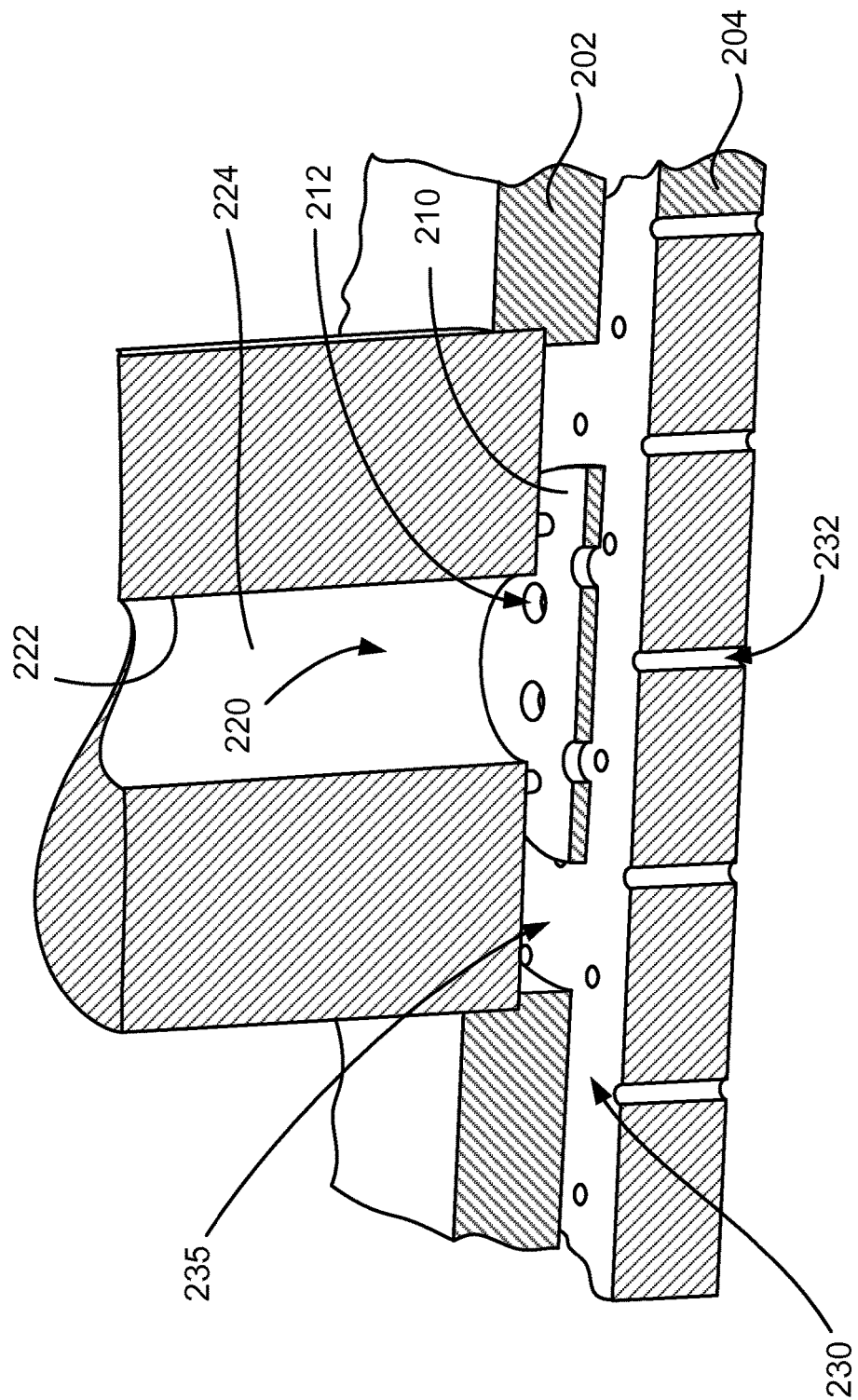
FIG. 3 shows a magnified isometric section view of the porous baffle in the low volume showerhead of FIG. 2.

The low volume showerhead 200 can further include a porous baffle 210 in a region 235 between the plenum volume 230 and the gas inlet 220. FIG. 3 shows a magnified isometric section view of the porous baffle 210 in the low volume showerhead 200 of FIG. 2. In some implementations, the porous baffle 210 can be recessed in the region 235, where the porous baffle 210 may be mounted at a certain distance from the gas inlet 220 and above the plenum volume 230. While the porous baffle 210 may be positioned within the region 235, it is understood that the porous baffle 210 may be positioned within the plenum volume 230 in some other implementations. Thus, the porous baffle 210 may be mounted at a distance from the gas inlet 220 that extends through the region 235. The region 235 can be a recessed volume of the backplate 202. The region provides a transition area for the flow of gas between the gas inlet 220 and the plenum volume 230. In some implementations, the region 235 can be recessed into the second side of the backplate 202, where the second side of the backplate 202 defines the second surface of the plenum volume 230. In some implementations, each of the stem 222, the region 235, and the plenum volume 230 define a cylindrical volume, where a diameter of the plenum volume 230 is greater than a diameter of the region 235, and the diameter of the region 235 is greater than a diameter of the stem 222.

While it is understood that the porous baffle 210 may be characterized as positioned in a region 235 between the plenum volume 230 and the gas inlet 220, it should be understood by a person of ordinary skill in the art that the region 235 may be considered as part of the gas inlet 220, and that the porous baffle 210 may be positioned within the gas inlet 220. However, rather than blocking the flow of gas while being positioned in the gas inlet 220, the porous baffle 210 may have a porosity that permits gas to flow through.

The baffle 210 can be selectively porous, where the porosity of the baffle 210 can be between about 5% and about 25%. In some implementations, the baffle 210 can include or otherwise made of a porous material. Examples of porous material can include porous aluminum, porous alumina, and porous quartz. The baffle 210 can be made of any suitable material, including but not limited to aluminum, alumina, quartz, and stainless steel. The material may be compatible with remote cleans and may be material that passivates or does not readily react with ammonia/fluorine radicals. In some implementations, the baffle 210 can include a plurality of through-holes 212 extending through the baffle 210. The through-holes 212 may be provided through a material of the baffle 210 to effectively simulate and mimic porosity. In some implementations, the baffle 210 can be circular and have a diameter greater than a diameter of the stem 222. However, in some implementations, the baffle 210 is substantially smaller than the faceplate 204. For example, a diameter of the faceplate 204 is at least four times greater than a diameter of the baffle plate 210, or at least ten times greater than a diameter of the baffle plate 210. Also, the baffle 210 can have a diameter smaller than the diameter of the region 235. Accordingly, gas flow may be directed not only through the through-holes 212, but also outwardly throughout the plenum volume 230 towards the edges of the faceplate 204. By directing the flow of gas through the through-holes 212 and outwardly throughout the plenum volume 230, a more spatially uniform flow of gas can be obtained despite lowering the overall internal volume of the showerhead 200 compared to the showerhead 100 in FIG. 1. Furthermore, the baffle 210 can be substantially centered on the gas inlet 220 so that the position of the baffle 210 and the porosity of the baffle 210 can minimize the effects of gas jetting through the center of the faceplate 204. In some implementations, the baffle 210 can be substantially parallel to the first surface and the second surface of the plenum volume 230.

Figure 4B:
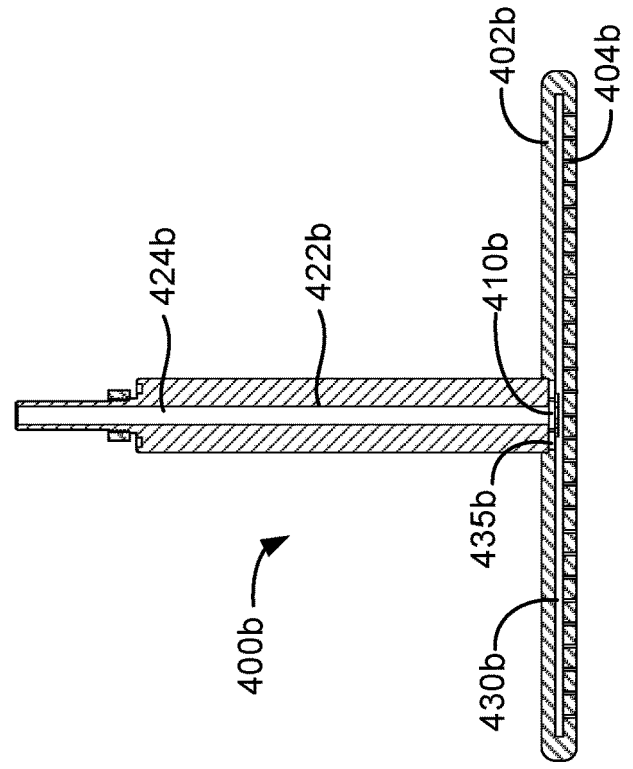
FIG. 4A and FIG. 4B show a side-by-side comparison of side section views of two example showerheads.
Figure 4A:
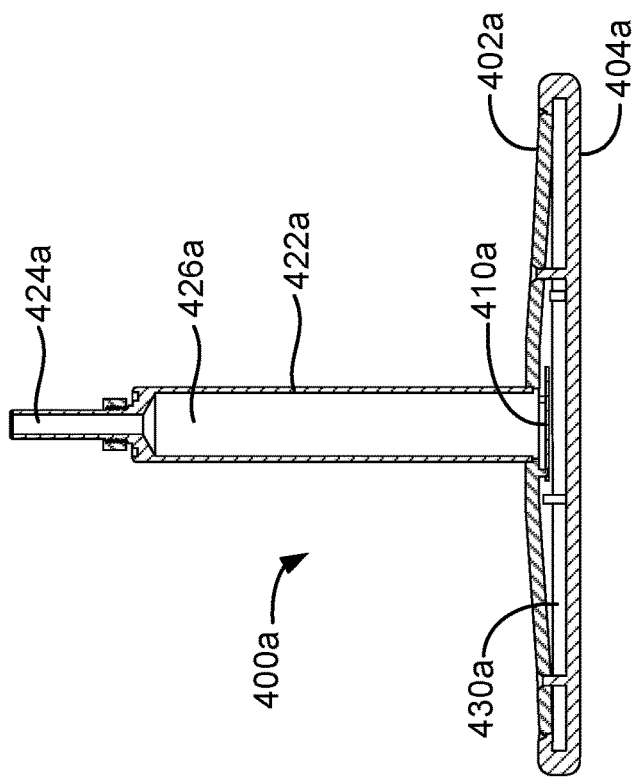

FIG. 4A and FIG. 4B show a side-by-side comparison of side section views of two example showerheads 400a, 400b. A conventional showerhead 400a is shown on the left side in FIG. 4A and a low volume showerhead 400b of the present disclosure is shown on the right side in FIG. 4B. The conventional showerhead 400a can correspond to the showerhead 100 in FIG. 1, and the low volume showerhead 400b can correspond to the low volume showerhead 200 in FIG. 2.

Each showerhead 400a, 400b includes a backplate 402 and a faceplate 404 opposite the backplate 402. The backplate 402a and the faceplate 404a of the conventional showerhead 400a at least partially define a plenum volume 430a, where the plenum volume 430a includes both a cylindrical portion and a conical portion over the cylindrical portion. The backplate 402b and the faceplate 404b of the low volume showerhead 400b at least partially define a plenum volume 430b, where the plenum volume 430b includes a cylindrical portion. Each showerhead 400a, 400b also includes a stem 422a, 422b through which gas is delivered into the plenum volume 430a, 430b. The stem 422a in the conventional showerhead 400a includes a narrow tube 424a and an expanded tube 426a, and the stem 422b in the low volume showerhead 400b includes a narrow tube 424b. Thus, the conventional showerhead 400a may have a significantly larger volume than the low volume showerhead 400b because of a larger stem diameter and a larger plenum height. The larger volume in the conventional showerhead 400a may lead to recirculation zones with respect to the flow of gas in the plenum volume 430a that can result in flow uniformity drifting. The larger volume in the conventional showerhead 400a may also lead to longer purge time and increased transient time, resulting in a reduced throughput.

Additionally, the showerheads 400a, 400b include baffles 410a, 410b, where the conventional showerhead 400a includes a large, non-porous baffle 410a and the low volume showerhead 400b includes a small, porous baffle 410b. In some implementations, the small, porous baffle 410b is recessed in a region 435b between the plenum volume 430b and the stem 422b. In some implementations, the region 435b can constitute an extension of the stem 422b, where the region 435b has a larger diameter than the narrow tube 424b. The small, porous baffle 410b may be considered to be inside the stem 422b in such implementations. In some implementations, the region 435b can serve as a diffuser, where the diffuser can be conical or cylindrical in shape. The small, porous baffle 410b may increase flux through the center of the faceplate 404 compared to the large, non-porous baffle 410a. In some implementations, the number of holes and the arrangement of holes in the small, porous baffle 410b can provide a more spatially uniform flow of gas through the faceplate 404b. In some implementations, the number and the arrangement of holes in the faceplate 404b can also affect the spatial uniformity of flow of gas through the faceplate 404b. For example, a reduced hole count in the faceplate 404b can increase the pressure drop across the faceplate 404b to push the flow of gas more outwardly towards the edges of the faceplate 404b.

Table 1 shows a comparison of features and values between the conventional showerhead 400a and the low volume showerhead 400b.

TABLE 1

| Feature | Conventional Showerhead 400a | Low Volume Showerhead 400b |
|---|---|---|
| Overall internal volume | 742.7 milliliters | 256.4 milliliters |
| Height (stem to faceplate) | 10.55 inches | 10.55 inches |
| Faceplate diameter | 13 inches | 13 inches |
| Plenum shape | Conical (sloped back) | Cylindrical (parallel back) |
| Plenum height (at edge) | 0.25 inches | 0.125 inches |
| Hole pattern | Hexagonal | Triangular |
| Hole count | 3292 | 2257 |
| Hole diameter | 0.04 inches | 0.04 inches |
| Expansion zone in stem | Yes (1.21 inch diameter) | No |
| Baffle | Solid baffle | Porous baffle |
| Baffle diameter | 2.13 inches | 0.79 inches |
| Baffle through-hole diameter | N/A | 0.08 inches (6 through-holes) |
| Baffle recessed in region between stem and plenum? | No | Yes |
| Baffle thickness | 0.064 inches | 0.04 inches |

The low volume showerhead 400b of the present disclosure can have an overall internal volume less than about 700 milliliters, or between about 50 milliliters and about 500 milliliters, or between about 100 milliliters and about 300 milliliters. In Table 1, the low volume showerhead 400b of the present disclosure reduces the overall internal volume of the conventional showerhead 400a from 742.7 milliliters to 256.4 milliliters, which represents a 65% reduction in volume. The plenum height in the conventional showerhead 400a can be reduced from 0.25 inches to 0.125 inches in the low volume showerhead 400b. The plenum shape in the conventional showerhead 400a can be substantially conical, or at least comprise a combination of a substantially conical portion and a substantially cylindrical portion. A cone divergence of the substantially conical portion can be greater than about 90 degrees, or greater than about 120 degrees. The plenum shape in the low volume showerhead 400b can be cylindrical or substantially cylindrical. The stem diameter in the conventional showerhead 400a can be reduced from a diameter of 1.21 inches to a diameter of about 0.125 inches and higher in the low volume showerhead 400b. In some implementations, this can reduce the purge time and improve throughput in semiconductor applications, such as for ALD applications. In some implementations, the stem diameter in the low volume showerhead 400b can transition from the smaller diameter to a larger diameter in a transition region 435b, where the larger diameter can be about 1.21 inches or less.

In some implementations, the number of through-holes in the faceplate 404a, 404b can influence the uniformity of flow across the faceplate 404a, 404b. When an internal volume of a showerhead is reduced, providing a more uniform distribution of flow across a faceplate may necessitate an increase in the pressure drop between a plenum volume and a processing chamber. Generally, gas flows along a path of least resistance, so if the faceplate 404b in the low volume showerhead 400b has a low pressure drop, then the flow of gas would jet through the center of the faceplate 404b. A higher pressure drop, however, would push the flow of gas more outwardly towards the edges of the faceplate 404b. To facilitate a higher pressure drop, a number of through-holes in the faceplate 404b may be decreased to accompany a reduced internal volume from the conventional showerhead 400a to the low volume showerhead 400a. Otherwise, if there is an excess number of through-holes in the faceplate 404b, then the pressure drop may be too low and flux would be not be uniform across the faceplate 404b from center to the edge. In some implementations, the number of through-holes in the faceplate 404b in the low volume showerhead 400b can be between about 1000 through-holes and about 3000 through-holes, or between about 1500 through-holes and about 2500 through-holes. For example, in Table 1, the conventional showerhead 400a can be reduced from 3292 through-holes to 2257 through-holes in the low volume showerhead 400b.

For a given flow rate of gas through the low volume showerhead 400b, the number of through-holes in the faceplate 404b can achieve a particular pressure drop and thereby provide a particular distribution of flow across the faceplate 404. If the flow rate of gas were low, then fewer through-holes would be necessary to achieve a desired uniformity of flow across the faceplate 404b.

In some implementations, the arrangement of through-holes in the faceplate 404a, 404b can also influence the uniformity of flow across the faceplate 404a, 404b. In some implementations, geometric arrangement of the through-holes can be hexagonal. For example, the conventional showerhead 400a can have a faceplate 404a with a hexagonal arrangement of through-holes. In some implementations, the geometric arrangement of the through-holes can be triangular. For example, the low volume showerhead 400b can have a faceplate 404b with a triangular arrangement of through-holes.

The conventional showerhead 400a can include a large, non-porous baffle 410a centered underneath the stem 422a to avoid or otherwise minimize the effects of jetting through the center of the faceplate 404a. The large, non-porous baffle 410a can have a diameter of 2.13 inches. The diameter of the non-porous baffle 410a can be greater than a diameter of the expanded tube 426a in the conventional showerhead 400a. However, a volume of the plenum volume 430a may be increased to accommodate the large, non-porous baffle 410a underneath the stem 422a for sufficient flow uniformity. The increased volume may be provided by a conical portion of the plenum volume 430a so that the flow of gas may be distributed outwardly. The backplate 402a may be sloped back to provide the conical portion of the plenum volume 430a.

In contrast, the low volume showerhead 400b of the present disclosure can include a small, porous baffle 410b centered underneath the stem 422b to avoid or otherwise minimize the effects of jetting through the center of the faceplate 404b. In some implementations, the small, porous baffle 410b can be substantially smaller than the large, non-porous baffle 410a. The small, porous baffle 410b can have a diameter between about 0.1 inches and about 2.0 inches. For example, the small, porous baffle 410b can have a diameter of 0.79 inches. A diameter of the faceplate 404b can be substantially larger than the diameter of the small, porous baffle 410b. For example, the diameter of the faceplate 404b can be 13 inches. In some implementations, the diameter of the faceplate 404b can be at least four times greater than the diameter of the small, porous baffle 410b, or at least ten times greater than the diameter of the small, porous baffle 410b.

Figure 5:
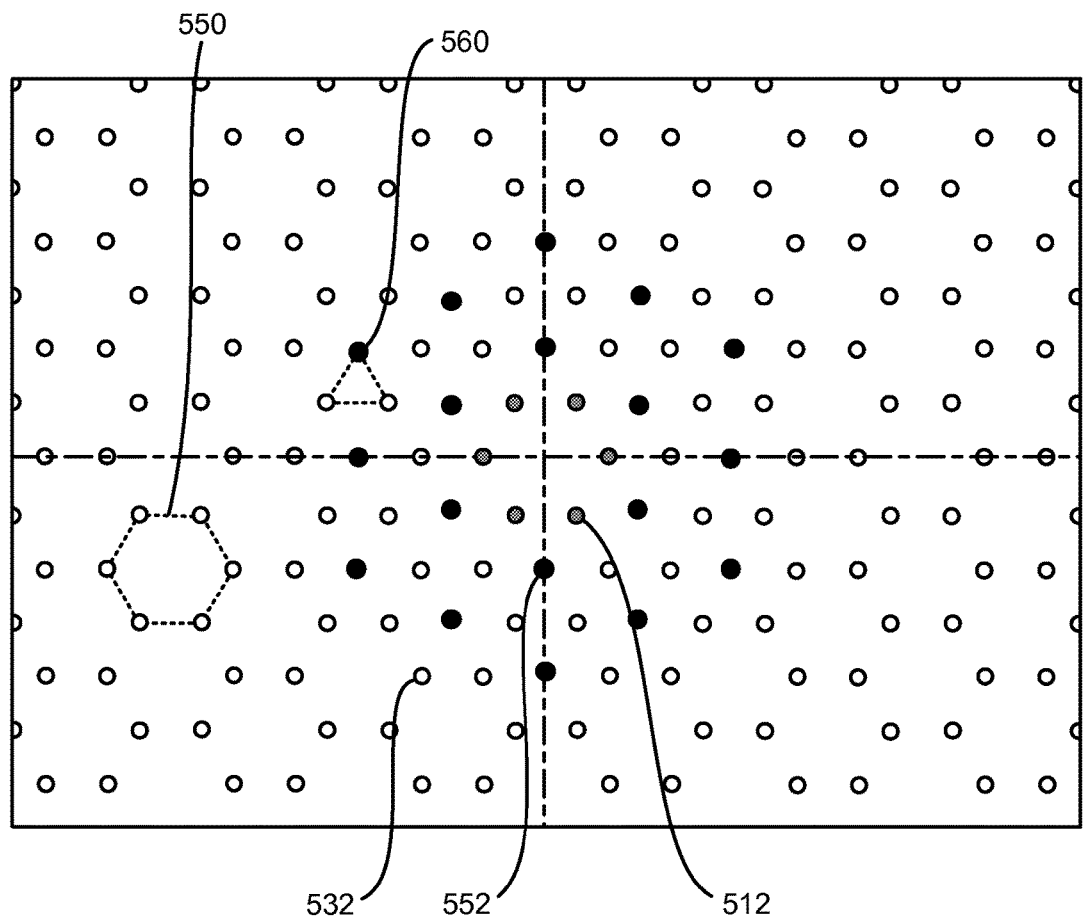
FIG. 5 shows an example layout of an arrangement of through-holes for a faceplate and a porous baffle in a low volume showerhead.

Typically, the reduction in the internal volume from the conventional showerhead 400a to the low volume showerhead 400b produces a "volume penalty" where the reduced internal volume adversely affects flow uniformity by reducing flow uniformity across the faceplate 404b. To avoid this volume penalty in a low volume showerhead 400b, the present disclosure can provide a small, porous baffle 410b where the small, porous baffle 410b can be positioned in a region 435b between the plenum volume 430b and the stem 422b. The small, porous baffle 410b can be positioned above the plenum volume 430b without blocking the flow of gas. Instead, the small, porous baffle 410b can be positioned in the region 435b for improved flow uniformity, where the diameter of the small, porous baffle 410b as well as the size, number, and arrangement of through-holes in the small, porous baffle 410b can direct the flow of gas into the volume plenum 430b, thereby influencing flow uniformity across the faceplate 404b. In addition, the size, number, and arrangement of through-holes in the faceplate 404b can be configured to achieve a higher pressure drop across the faceplate 404b and obtain a desired flow uniformity. For example, a diameter of the through-holes in the small, porous baffle 410b can be between about 0.01 inches and about 0.15 inches, such as about 0.08 inches. The small, porous baffle 410b can include six holes arranged in a hexagonally-shaped ring, as illustrated in FIG. 5 and FIG. 7B. The six holes may be positioned closer towards the edge of the small, porous baffle 410b than the center of the small, porous baffle 410b. A diameter of the through-holes in the faceplate 404b can be between about 0.01 inches and about 0.10 inches, such as about 0.04 inches. The faceplate 404b can include over 2000 holes arranged in a plurality of triangular patterns, as illustrated in FIG. 5.

FIG. 5 shows an example layout of an arrangement of through-holes 532, 552 for a faceplate and through-holes 512 a porous baffle in a low volume showerhead. Through-holes 532 in a faceplate in a conventional showerhead can form a hexagonal arrangement 550, and through-holes 552 may be added to the through-holes 532 in a low volume showerhead to form a triangular arrangement 560. Through-holes 512 in a porous baffle may be positioned over through-holes 532 of the faceplate. The arrangement of through-holes 512 in a porous baffle and the arrangement of through-holes 532, 552 in a faceplate can influence the uniformity of flow across the faceplate.

Figure 6A:
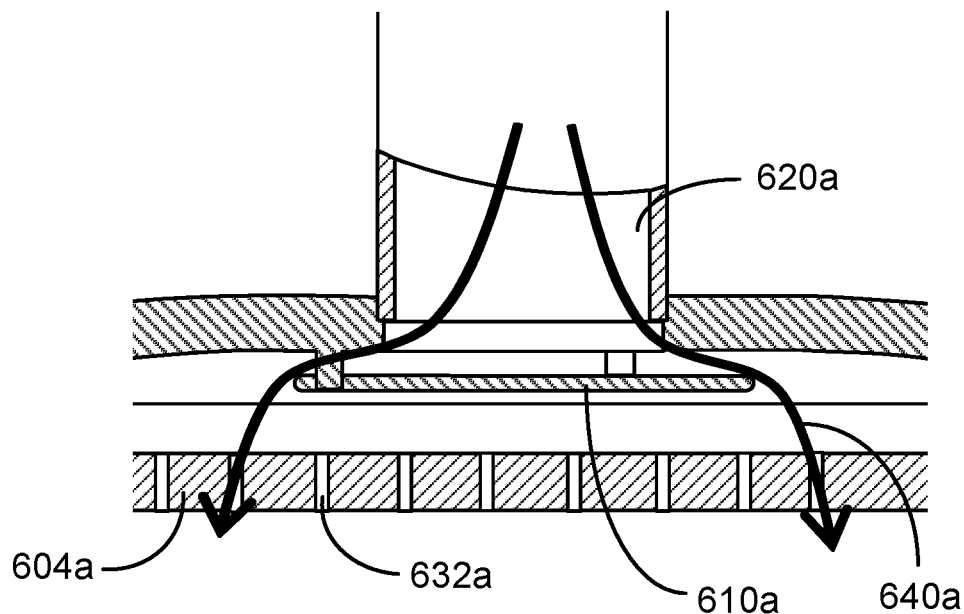
FIG. 6A shows a side section view of a portion of an example showerhead including a baffle with arrows indicating nominal gas flow directions within the showerhead.
Figure 6B:
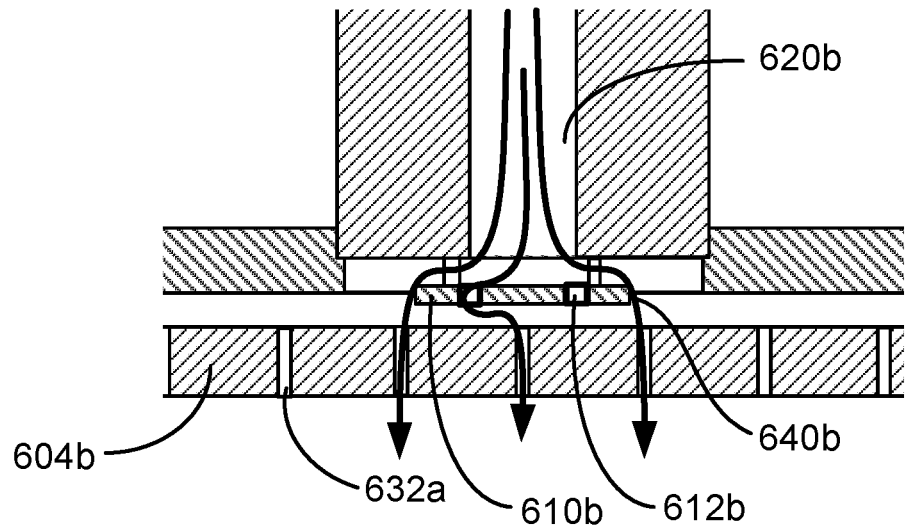
FIG. 6B shows a side section view of a portion of an example low volume showerhead including a porous baffle with arrows indicating nominal gas flow directions within the low volume showerhead.

FIG. 6A shows a side section view of a portion of an example showerhead including a baffle 610a with arrows 640a indicating nominal gas flow directions within the showerhead. FIG. 6B shows a side section view of a portion of an example low volume showerhead including a porous baffle 610b with arrows 640b indicating nominal gas flow directions within the low volume showerhead. Flow vectors 640a for flow of gas from a gas inlet 620a can be indicated by arrows in FIG. 6A, and flow vectors 640b for flow of gas from a gas inlet 620b can be indicated by arrows in FIG. 6B. The position, size, and porosity of the baffles 610a, 610b can influence the flow vectors 640a, 640b through the through-holes 632a, 632b of the faceplates 604a, 604b. The size, arrangement, and number of through-holes 612b in the baffle 610b can influence the flow vectors 640b through the through-holes 632b of the faceplate 604b. In FIG. 6A, a baffle 610a can direct the flow vectors 640a outwardly towards the edges of a faceplate 604a. However, in FIG. 6B, a porous baffle 610b can direct the flow vectors 640b outwardly towards the edges and towards the center of the faceplate 604b, resulting in increased flux towards the center of the faceplate 604b. In ALD applications, this can lead to a higher concentration of dose at the center of the substrate.

Figure 7A:
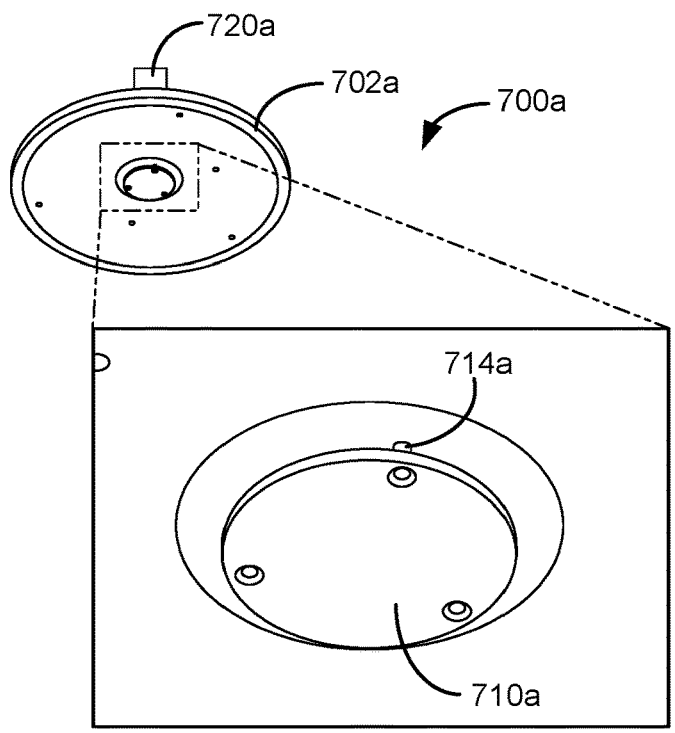
FIG. 7A shows an isometric view of an example baffle in a showerhead.
Figure 7B:
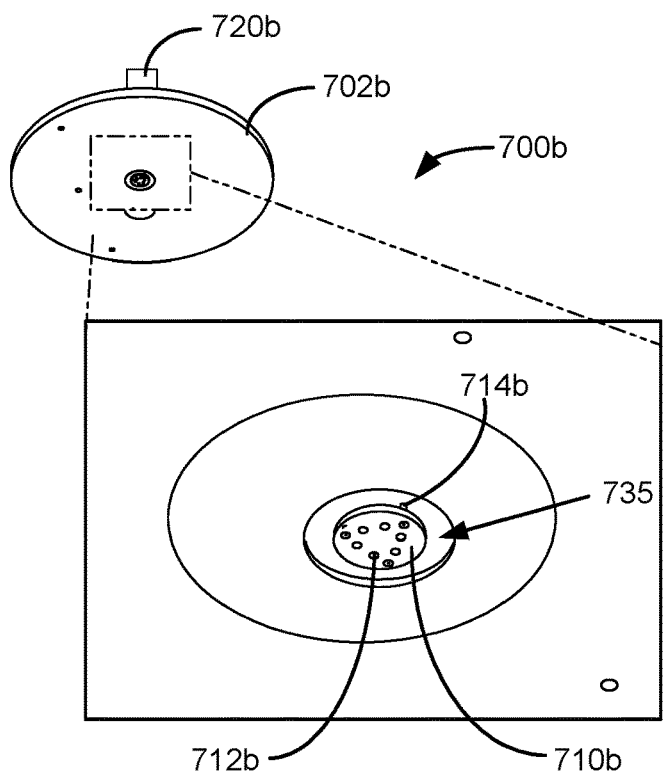
FIG. 7B shows an isometric view of an example baffle including a plurality of through-holes in a showerhead.

FIG. 7A shows an isometric view of an example baffle 710a in a conventional showerhead 700a. The conventional showerhead 700a includes a backplate 702a and a gas inlet 720a fluidly coupled to a plenum volume of the conventional showerhead 700a through the backplate 702a. A baffle 710a may be recessed in the plenum volume, where the baffle 710a may be mounted from a side of the backplate 702a via one or more internal support posts 714a.

FIG. 7B shows an isometric view of an example baffle 710b including a plurality of through-holes 712b in a low volume showerhead 700b. The low volume showerhead 700b includes a backplate 702b and a gas inlet 720b fluidly coupled to a plenum volume of the low volume showerhead 700b through the backplate 702b. At an interface between the backplate 702b and the gas inlet 720b, a pocket or transition region 735b is provided between the plenum volume and the gas inlet 720b. In some implementations, a baffle 710b may be recessed in the transition region 735b or extending from the transition region 735b, where the baffle 710b may be mounted from the transition region 735b via one or more internal support posts 714b. The baffle 710b may include a plurality of through-holes 712b. In some implementations, the plurality of through-holes 712b may be selectively arranged more towards the edges of the baffle 710b than the center of the baffle 710b. In some implementations, the porosity of the baffle 710b can be between about 5% and about 25%, such as about 10%. In some implementations, the baffle 710b can made of a porous material or the baffle 710b can be made of a solid material with through-holes 712b provided therethrough. In some implementations, the through-holes 712b of the baffle 710b may be arranged in a hexagonal pattern.

Figure 8:
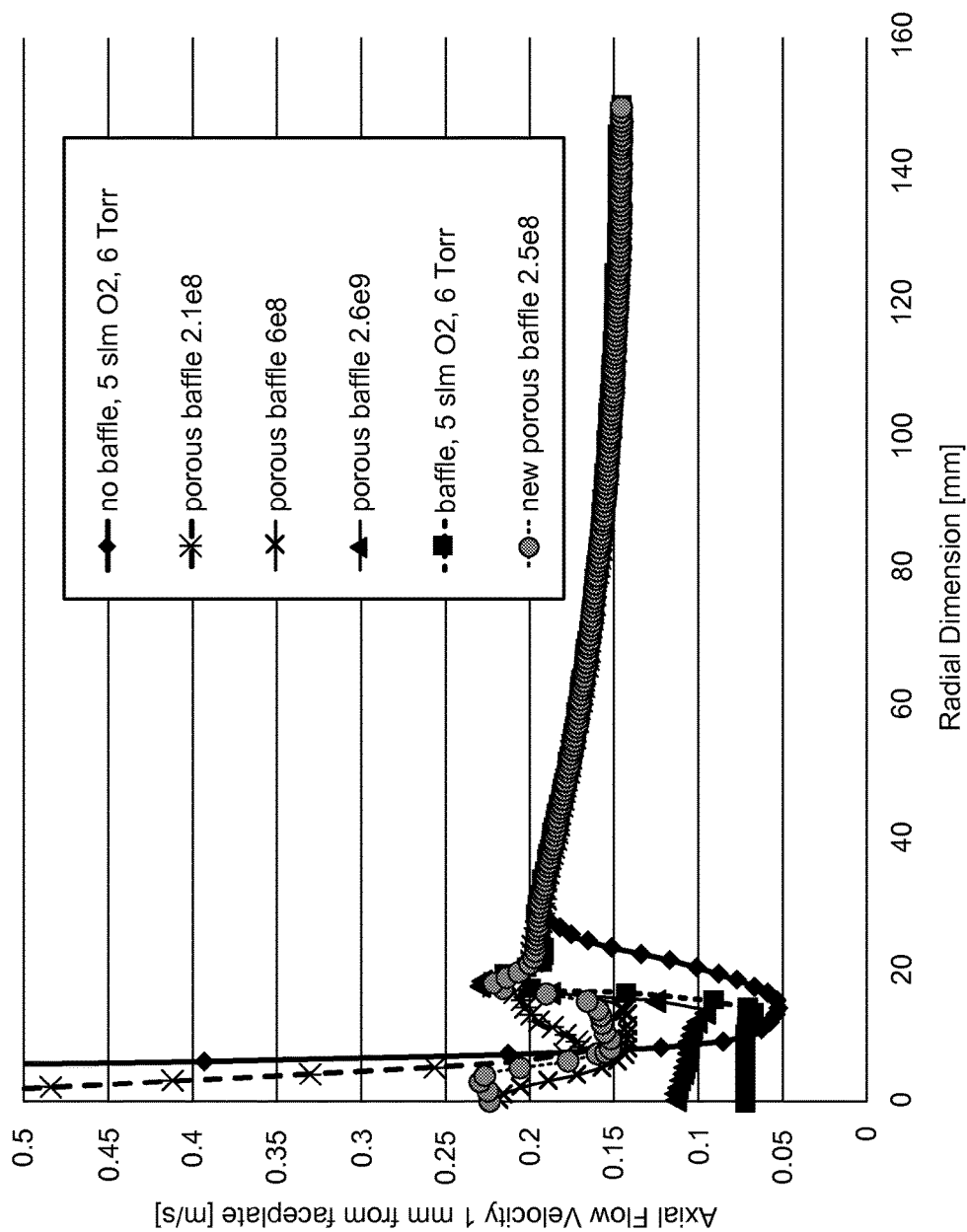
FIG. 8 shows a graph depicting axial flow velocity of gas from a faceplate of a showerhead as a function of a radial dimension of the faceplate.

FIG. 8 shows a graph depicting axial flow velocity of gas from a faceplate of a showerhead as a function of a radial dimension of the faceplate. The axial flow velocity as measured 1 mm from a faceplate of a showerhead can reflect the uniformity of the flow of gas from the showerhead, where the axial flow velocity is graphically depicted from center to edge of the faceplate. At 5 standard liters per minute (slm) of oxygen and a pressure of 6 Torr, a showerhead without a baffle exhibits extremely fast axial flow velocity near the center of the faceplate and extremely slow axial flow velocity within a few millimeters of near the center of the faceplate. Without a baffle, the flow uniformity from center to edge of the faceplate is very poor. At 5 slm of oxygen and a pressure of 6 Torr, a showerhead with a non-porous baffle exhibits very slow axial flow velocity around the center of the faceplate and increased axial flow velocity closer towards the edge of the faceplate. With a non-porous baffle, the flow uniformity from center to edge of the faceplate is poor. With a porous baffle that is 2.5 mm from the surface of the showerhead and including six through-holes each being 0.08 inches in diameter, the axial flow velocity from the center to edge of the faceplate is relatively uniform. The porous baffle can be 2 cm in diameter and 1 mm thick, and the six through-holes can be centered at 1 cm apart.

Figure 9:
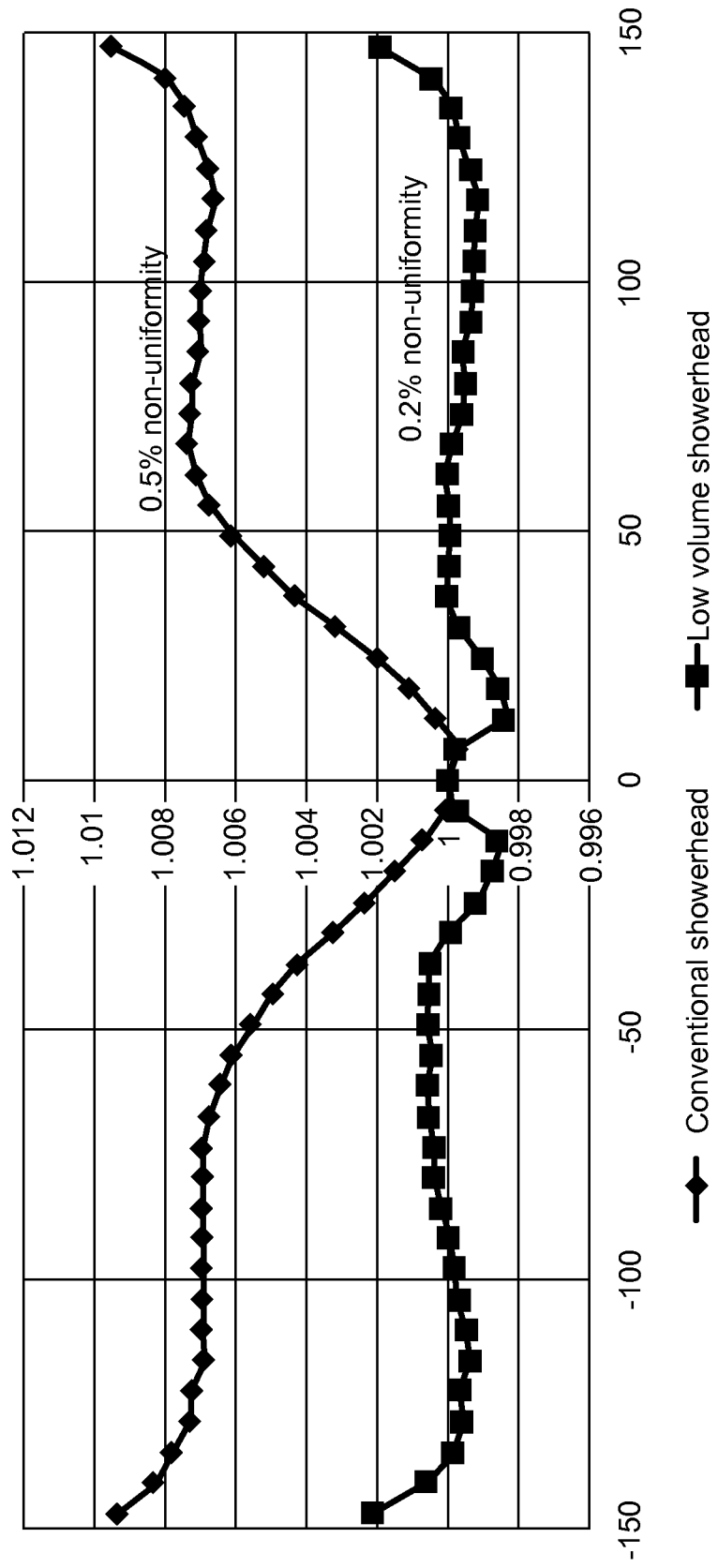
FIG. 9 shows a graph depicting a percentage of non-uniformity of atomic layer deposition for two showerheads.

FIG. 9 shows a graph depicting a percentage of film non-uniformity of atomic layer deposition for two showerheads. The film non-uniformity can be calculated by taking the difference between the thickest portion and the thinnest portion of the deposited film, and dividing that value by twice the mean of the thickness of the deposited film: % non-uniformity=(max−min)/(2*mean). In FIG. 9, the conventional showerhead can produce a produce a non-uniformity of about 0.5%, whereas the low volume showerhead of the present disclosure can yield a non-uniformity of about 0.2%. Thus, by designing the low volume showerhead of the present disclosure, film uniformity can be significantly improved in ALD processing.

The low volume showerhead of the present disclosure can provide a hardware configuration that can obtain film uniformity without having to compensate by adjusting various process steps or process knobs. In other words, by providing a low volume showerhead that is targeted towards improving film uniformity, the film uniformity may be decoupled from process parameters. As a result, film properties such as wet etch rate, and dry etch rate can be decoupled from the film uniformity. Additional film properties may include dielectric constant, refractive index, wet etch rate, dry etch rate, optical properties, porosity, density, composition, hardness and modulus, resist strip and ash rate, chemical mechanical planarization removal rate, and more.

Typically, obtaining a desirable level of film uniformity can be accomplished by adjusting various process parameters. In some implementations, process parameters such as flow rates, dose time, purge time, radio-frequency (RF) power, RF on time, and other process parameters can be tuned to achieve a desirable film uniformity. By way of an example, film uniformity can be improved by increasing processing times for each ALD cycle to provide greater saturation. However, throughput would be decreased. In another example, film uniformity can be improved by flowing more precursor (e.g., dose increase). However, increasing the precursor dose can lead to increased chemical cost, adverse effects on the stoichiometry on the film, and undesirable changes to film properties like wet etch rate and dry etch rate. Thus, typical approaches for obtaining a desirable level of film uniformity can undesirably impact throughput and film properties.

Table 2 compares the low volume showerhead of the present disclosure with process parameters of dose increase, RF power, and RF on time with respect to film uniformity (center thickness) and film properties (wet etch rate and dry etch rate).

TABLE 2

|  | Center Thickness | Wet Etch Rate | Dry Etch Rate |
| --- | --- | --- | --- |
| Low Volume Showerhead | Increases | No effect | No effect |
| Dose Increase | Increases | Increases | Increases |
| RF Power | Decreases | No effect | Decreases |
| RF On Time | Decreases | Decreases | No effect |

As shown in Table 2, the low volume showerhead of the present disclosure increases the center thickness of the deposited film without affecting the wet etch rate and the dry etch rate of the deposited film. However, adjusting process parameters such as dose level, RF power, and RF on time does not decouple the film uniformity from the film properties. Increasing the dose increases the wet etch rate and the dry etch rate of the deposited film. Decreasing the RF power decreases the dry etch rate of the deposited film, and decreasing the RF on time decreases the wet etch rate of the deposited film. Hence, providing the low volume showerhead can provide a wider process window for semiconductor processing while obtaining a desirable level of film uniformity without having to fine-tune process parameters like flow rates, dose time, purge time, etc. to obtain the desirable level of film uniformity. In some implementations, the low volume showerhead can achieve a film non-uniformity of less than about 1.0%, such as less than about 0.5% or less than about 0.3%. In some implementations, a film non-uniformity of less than about 1.0% can be achieved with an ALD cycle of 1.5 seconds or less. For example, the dose time can be 0.4 seconds or less, the purge time can be 0.4 seconds or less, and plasma step can be 0.4 seconds or less, and the post-plasma purge step can be 0.15 seconds or less. In contrast, an ALD cycle in a conventional showerhead can be greater than about 1.5 seconds per cycle, with a dose time being 0.6 seconds or more, the purge time being 0.4 seconds or more, the plasma step being 0.4 seconds or more, and the post-plasma purge step being 0.15 seconds or more. The low volume showerhead can increase throughput by reducing the total time for an ALD cycle while obtaining a desirable level of film uniformity. Moreover, the low volume showerhead can obtain the desirable level of film uniformity without affecting other film properties, such as wet etch rate and dry etch rate.

A low volume showerhead of the present disclosure may be installed in a semiconductor process chamber. A process chamber can include a low volume showerhead that is mounted to the top of a chamber housing. A substrate support may support a semiconductor substrate within the process chamber and beneath the low volume showerhead. A microvolume may be formed between the substrate support and the low volume showerhead. The microvolume may serve as a substrate reaction area and may help concentrate and retain process gases in the vicinity of the semiconductor substrate during processing. The substrate support may be configured to move up and down to facilitate loading and unloading operations. In some implementations, the low volume showerhead may be suspended from a lid of the process chamber by a stem and may not itself form part of the "lid" of the process chamber. In such implementations, the low volume showerhead may be configured to move up and down to facilitate substrate loading and unloading operations.

In some implementations, one or more process chambers may be provided as process stations in a multi-station semiconductor processing too. In some implementations, a single process chamber may include multiple processing stations, some or all of which may have their own low volume showerhead assemblies.

Figure 10:
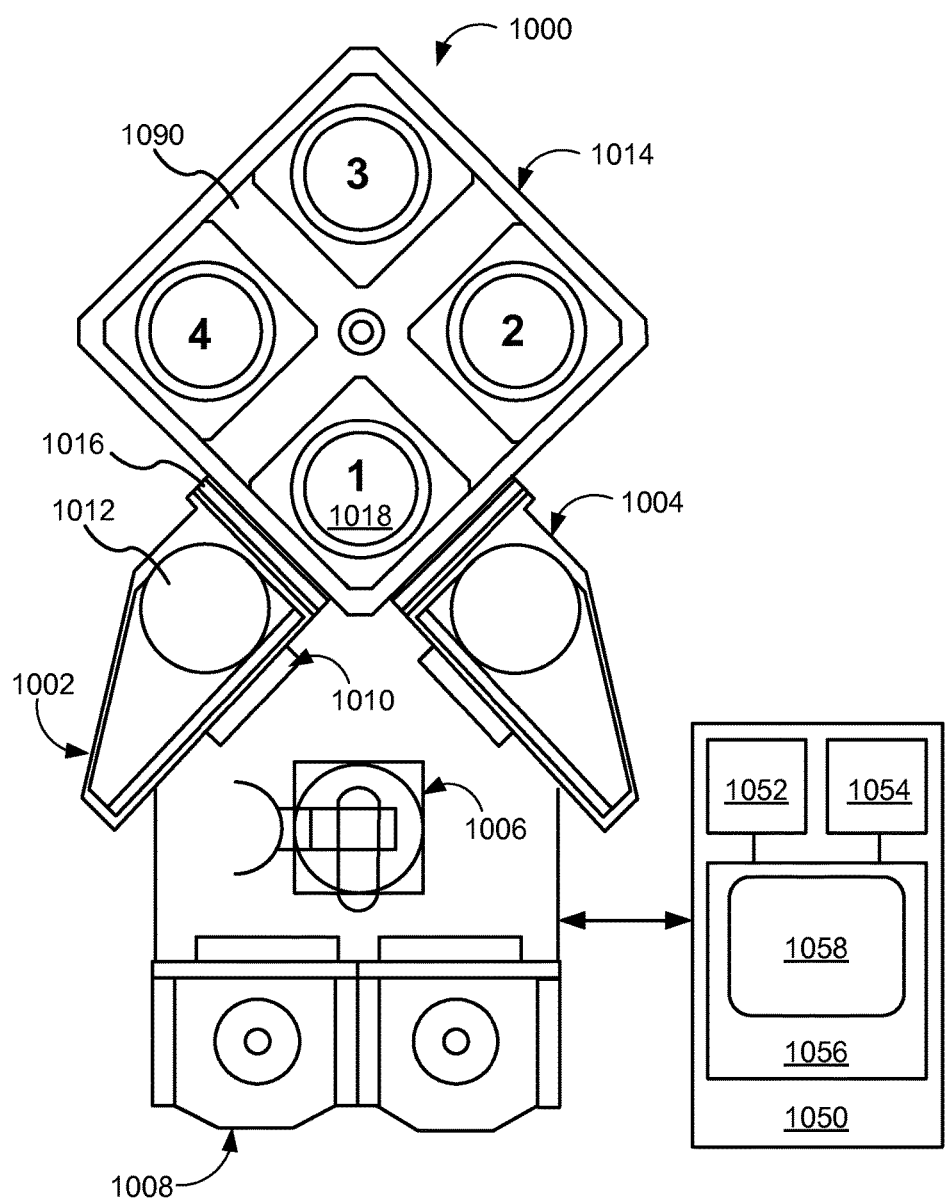
FIG. 10 shows a schematic view of a multi-station processing tool that may include a low volume showerhead with a porous baffle.

FIG. 10 shows a schematic view of a multi-station processing tool that may include a low volume showerhead with a porous baffle. The multi-station processing tool 1000 may include an inbound load lock 1002 and an outbound load lock 1004. A robot 1006, at atmospheric pressure, can be configured to move substrates from a cassette loaded through a pod 1008 into inbound load lock 1002 via an atmospheric port 1010. A substrate may be placed by the robot 1006 on a pedestal 1012 in the inbound load lock 1002, the atmospheric port 1010 may be closed, and the load lock may then be pumped down. If the inbound load lock 1002 includes a remote plasma source, the substrate may be exposed to a remote plasma treatment in the load lock prior to being introduced into a processing chamber 1014. Further, the substrate also may be heated in the inbound load lock 1002, for example, to remove moisture and adsorbed gases. Next, a chamber transport port 1016 to processing chamber 1014 may be opened, and another robot (not shown) may place the substrate into the processing chamber 1014 on a pedestal of a first station shown in the reactor for processing. While the implementation depicted in FIG. 10 includes load locks, it will be appreciated that, in some implementations, direct entry of a substrate into a process station may be provided.

The depicted processing chamber 1014 includes four process stations, numbered from 1 to 4 in the implementation shown in FIG. 10. Each station may have a heated or unheated pedestal (shown at 1018 for station 1), and gas line inlets. It will be appreciated that in some implementations, each process station may have different or multiple purposes. For example, in some implementations, a process station may be switchable between an ALD and plasma-enhanced chemical vapor deposition (PECVD) process mode. Additionally or alternatively, in some implementations, processing chamber 1014 may include one or more matched pairs of ALD and PECVD process stations. While the depicted processing chamber 1014 comprises four stations, it will be understood that a processing chamber according to the present disclosure may have any suitable number of stations. For example, in some implementations, a processing chamber may have five or more stations, while in other implementations a processing chamber may have three or fewer stations.

Each station may include a separate showerhead assembly that delivers process gases to a substrate at the associated station. In some implementations, some or all of these showerheads may utilize a low volume showerhead with a porous baffle as described herein. For example, if a station provides ALD processing, or other processing that may benefit from use of the equipment described herein, to a substrate, the showerhead for that station may be a low volume showerhead with a porous baffle as discussed herein.

FIG. 10 also depicts a substrate handling system 1090 for transferring substrates within processing chamber 1014. In some implementations, substrate handling system 1090 may transfer substrates between various process stations and/or between a process station and a load lock. It will be appreciated that any suitable substrate handling system may be employed. Non-limiting examples include substrate carousels and substrate handling robots. FIG. 10 also depicts a system controller 1050 employed to control process conditions and hardware states of process tool 1000. System controller 1050 may include one or more memory devices 1056, one or more mass storage devices 1054, and one or more processors 1052. Processor 1052 may include a CPU or computer, analog and/or digital input/output connections, stepper motor controller boards, etc.

In some implementations, a controller 1050 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 1050, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 1050 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The controller 1050, in some implementations, may be a part of or coupled to a computer that is integrated with, coupled to the system, otherwise networked to the system, or a combination thereof. For example, the controller 1050 may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller 1050 is configured to interface with or control. Thus as described above, the controller 1050 may be distributed, such as by comprising one or more discrete controllers that are networked together and working towards a common purpose, such as the processes and controls described herein. An example of a distributed controller 1050 for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor substrate.

As noted above, depending on the process step or steps to be performed by the tool, the controller 1050 might communicate with one or more of other tool circuits or modules, other tool components, cluster tools, other tool interfaces, adjacent tools, neighboring tools, tools located throughout a factory, a main computer, another controller, or tools used in material transport that bring containers of substrates to and from tool locations and/or load ports in a semiconductor manufacturing factory.

In some implementations, system controller 1050 controls all of the activities of process tool 1000. System controller 1050 executes system control software 1058 stored in mass storage device 1054, loaded into memory device 1056, and executed on processor 1052. System control software 1058 may include instructions for controlling the timing, mixture of gases, chamber and/or station pressure, chamber and/or station temperature, substrate temperature, target power levels, RF power levels, substrate pedestal, chuck and/or susceptor position, and other parameters of a particular process performed by process tool 1000. System control software 1058 may be configured in any suitable way. For example, various process tool component subroutines or control objects may be written to control operation of the process tool components necessary to carry out various process tool processes. System control software 1058 may be coded in any suitable computer readable programming language.

In some implementations, system control software 1058 may include input/output control (IOC) sequencing instructions for controlling the various parameters described above. For example, each phase of an ALD process may include one or more instructions for execution by system controller 1050. The instructions for setting process conditions for an ALD process phase may be included in a corresponding ALD recipe phase. In some implementations, multiple showerheads, if present, may be controlled independently to allow for separate, parallel process operations to be performed.

Other computer software and/or programs stored on mass storage device 1054 and/or memory device 1056 associated with system controller 1050 may be employed in some implementations. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 1018 and to control the spacing between the substrate and other parts of process tool 1000.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station or a gas flow into the process station.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations. The plasma control program may, in appropriate situations, include code for controlling an external plasma generator and/or valving required to supply process gas to a plasma generator or radical source volume.

In some implementations, there may be a user interface associated with system controller 1050. The user interface may include a display screen, graphical software displays of the apparatus and/or process conditions, and user input devices such as pointing devices, keyboards, touch screens, microphones, etc.

In some implementations, parameters adjusted by system controller 1050 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 1050 from various process tool sensors. The signals for controlling the process may be output on the analog and digital output connections of process tool 1000. Non-limiting examples of process tool sensors that may be monitored include mass flow controllers, pressure sensors (such as manometers), thermocouples, etc. Appropriately-programmed feedback and control algorithms may be used with data from these sensors to maintain process conditions.

The system controller 1050 may provide program instructions for implementing various semiconductor fabrication processes. The program instructions may control a variety of process parameters, such as DC power level, RF bias power level, pressure, temperature, etc. The instructions may control the parameters to operate in-situ deposition of film stacks.

A system controller may typically include one or more memory devices and one or more processors configured to execute the instructions so that the apparatus will perform a method in accordance with the present invention. Machine-readable media containing instructions for controlling process operations in accordance with the present invention may be coupled to the system controller.

While the semiconductor processing tool shown in FIG. 10 depicts a single, four-station process chamber, or module, other implementations of semiconductor processing tools may include multiple modules, each with a single station or multiple stations. Such modules may be interconnected with one another and/or arranged about one or more transfer chambers that may facilitate movement of substrates between the modules. One or more of the stations provided by such multi-module semiconductor processing tools may be equipped with low volume showerheads including porous baffles, as described herein, as needed.

Generally speaking, a low volume showerhead including a porous baffle as described herein may be mounted in a reaction chamber above a substrate support configured to support one or more semiconductor substrates. The low volume showerhead may, for example, also serve as a lid, or part of a lid, for the reaction chamber. In other implementations, the low volume showerhead may be a "chandelier" type showerhead and may be suspended from the lid of the reaction chamber by a stem or other support structure.

The apparatus/process described hereinabove may be used in conjunction with lithographic patterning tools or processes, e.g., steppers, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., wafer, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Although the foregoing has been described in some detail for purposes of clarity and understanding, it will be apparent that certain changes and modifications may be practiced within the scope of the appended claims. It should be noted that there are many alternative ways of implementing the processes, systems, and apparatus described. Accordingly, the described embodiments are to be considered as illustrative and not restrictive.

What is claimed is:

1. A showerhead for use in a semiconductor processing apparatus, the showerhead comprising:
    a plenum volume having a first surface and a second surface opposite the first surface, the first surface and the second surface at least partially defining the plenum volume of the showerhead;
    a faceplate including a plurality of first through-holes, the plurality of first through-holes extending from a first side to a second side of the faceplate, the first side of the faceplate defining the first surface of the plenum volume;
    a backplate opposite the faceplate; wherein a side of the backplate defines a second surface of the plenum volume;
    a stem connected to the backplate and in fluid communication with the plenum volume; and
    a baffle plate including a plurality of second through-holes, the baffle plate being positioned at least partially within or fully within a region between the plenum volume and the stem, wherein the region is recessed into the side of the backplate and is in direct fluid communication with the plenum volume and direct fluid communication with the stem.

2. The showerhead of claim 1, wherein a diameter of the faceplate is at least four times greater than a diameter of the baffle plate.

3. The showerhead of claim 2, wherein the diameter of the faceplate is at least ten times greater than the diameter of the baffle plate.

4. The showerhead of claim 1, further comprising:
    one or more gas inlets in the stem configured to deliver gas to the plenum volume, wherein the baffle plate is mounted in the recessed region below the one or more gas inlets and above the plenum volume.

5. The showerhead of claim 1, wherein a volume of the stem is between about 1 milliliter and about 50 milliliters.

6. The showerhead of claim 1, wherein each of the stem, the recessed region, and the plenum volume defines a cylindrical volume, and wherein a diameter of the plenum volume is greater than a diameter of the recessed region, and the diameter of the recessed region is greater than a diameter of the stem.

7. The showerhead of claim 1, wherein a volume of the showerhead is between about 50 milliliters and about 500 milliliters.

8. The showerhead of claim 7, wherein the volume of the showerhead is between about 100 milliliters and about 300 milliliters.

9. The showerhead of claim 1, wherein a porosity of the baffle plate is between about 5% and about 25%.

10. The showerhead of claim 1, wherein the plurality of second through-holes are positioned more towards the edges of the baffle plate than the center of the baffle plate.

11. The showerhead of claim 1, wherein the baffle plate is substantially centered on the stem and substantially parallel to the first surface and the second surface.

12. The showerhead of claim 1, wherein a number of first through-holes is between about 1500 and about 2500 through-holes.

13. The showerhead of claim 1, wherein the plurality of first through-holes are arranged in a triangular arrangement on the faceplate and the second through-holes are arranged in a hexagonal arrangement on the baffle plate.

14. A semiconductor processing station, the semiconductor processing station including the showerhead of claim 1.

15. The semiconductor processing station of claim 14, further comprising:
    a controller configured with instructions to perform the following operations:
        providing a substrate into the semiconductor processing station;
        introducing reactant gas into the semiconductor processing station through the showerhead to adsorb onto the surface of the substrate;
        introducing a purge gas into the semiconductor processing station through the showerhead; and
        applying a plasma to form a thin film layer from the adsorbed reactant gas on the surface of the substrate.

16. The semiconductor processing station of claim 15, wherein a film non-uniformity of the thin film layer is less than about 0.5%.

17. The semiconductor processing station of claim 16, wherein the film non-uniformity is decoupled from one or more process parameters associated with one or more of introducing the gas reactant, introducing the purge gas, and applying the plasma.

18. The semiconductor processing station of claim 15, wherein forming the thin film layer in an atomic layer deposition (ALD) cycle is performed in less than about 1.5 seconds.

19. A semiconductor processing tool, the semiconductor processing tool including the semiconductor processing station of claim 15.

20. The semiconductor processing tool of claim 19, wherein the semiconductor processing tool includes a stepper.

\* \* \* \* \*